United States Patent
Ishizaki

(10) Patent No.: US 6,939,731 B2
(45) Date of Patent: Sep. 6, 2005

(54) PRODUCTION METHOD FOR LIGHT EMITTING ELEMENT

(75) Inventor: Jun-ya Ishizaki, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 10/475,489

(22) PCT Filed: Apr. 25, 2002

(86) PCT No.: PCT/JP02/04127
§ 371 (c)(1),
(2), (4) Date: Oct. 22, 2003

(87) PCT Pub. No.: WO02/089223
PCT Pub. Date: Nov. 7, 2002

(65) Prior Publication Data
US 2004/0104392 A1 Jun. 3, 2004

(30) Foreign Application Priority Data

| Apr. 27, 2001 | (JP) | 2001-131328 |
| Apr. 27, 2001 | (JP) | 2001-131376 |
| Jul. 31, 2001 | (JP) | 2001-232608 |
| Aug. 30, 2001 | (JP) | 2001-260742 |

(51) Int. Cl.[7] .............................................. H01L 21/00
(52) U.S. Cl. .................. 438/22; 438/24; 438/104; 438/483; 438/518
(58) Field of Search .................. 438/22, 24, 104, 438/483, 518

(56) References Cited

U.S. PATENT DOCUMENTS 5,545,443 A  8/1996 Yamada et al.
6,222,868 B1  4/2001 Ouchi et al.
6,617,183 B2 * 9/2003 Kadota et al. ............... 438/22

FOREIGN PATENT DOCUMENTS

| EP | 1 115 163 A1 | 7/2001 |
| JP | 1-282199 | 11/1989 |
| JP | 4-37117 | 2/1992 |
| JP | 4-280975 | 9/1992 |
| JP | 0 863 555 A2 | 9/1998 |
| JP | 10-270749 | 10/1998 |
| JP | 11-168262 | 3/1999 |
| JP | 2001-445500 | 2/2001 |
| JP | 2001-68707 | 3/2001 |
| WO | WO 00/16411 | 3/2000 |
| WO | WO 00/0164110 | 3/2000 |

* cited by examiner

Primary Examiner—David Nelms
Assistant Examiner—Mai-Huong Tran
(74) Attorney, Agent, or Firm—Snider & Associates; Ronald R. Snider

(57) ABSTRACT

When a p-type $Mg_xZn_{1-x}O$-type layer is grown based on a metal organic vapor-phase epitaxy process, the p-type $Mg_xZn_{1-x}O$-type layer is annealed in an oxygen-containing atmosphere during and/or after completion of the growth of the p-type $Mg_xZn_{1-x}O$-type layer. In addition, a vapor-phase epitaxy process of a semiconductor layer is proceed while irradiating ultraviolet light to the surface of a substrate to be grown and source gasses. In addition, when a $Mg_xZn_{1-x}O$-type buffer layer that is oriented so as to align the c-axis thereof to a thickness-wise direction is formed by an atomic layer epitaxy process, a metal monoatomic layer is grown at first. In addition, a ZnO-base semiconductor active layer is formed by using a semiconductor material mainly composed of ZnO containing Se or Te. A light emitting device is formed by using these techniques.

19 Claims, 20 Drawing Sheets

○ : OXYGEN
● : ZINC OR MAGNESIUM (a)

(b)

(c)

(d)

○ : O ION

◉ : Zn ION
Mg ION $$\frac{N_{Mg}}{N_{Mg}+N_{Zn}} = \nu$$

PRODUCTION METHOD FOR LIGHT EMITTING ELEMENT

TECHNICAL FIELD

This invention relates to a light emitting device and a method of fabricating the same.

BACKGROUND ART

There have long been demands for high-luminance, light emitting device capable of causing short-wavelength emission in the blue light region. Such light emitting device has recently been realized by using AlGaInN-base materials. Rapid progress has also been made in applying the device to full-color, light emitting apparatuses or to display apparatuses by combining it with red and green high-luminance, light emitting devices. Use of the AlGaInN-base material, however, inevitably raises the costs because the material contains Ga and In as major components, both of which are relatively rare metals. One of other major problems of the material is that the growth temperature thereof is as high as 700 to 1,000° C., and thus consumes a considerably large amount of energy for the production. This is undesirable not only in terms of cost reduction, but also in terms of being against the stream of the times where discussions on energy saving and suppression of global warming are prevailing. Japanese Laid-Open Patent Publication No. 2001-44500 proposes a light emitting device having a more inexpensive ZnO-base compound semiconductor layer heteroepitaxially grown on a sapphire substrate. Japanese Laid-Open Patent Publication No. 11-168262 discloses a two-dimensional-array planar light emitting device using a light emitting layer portion composed of oxides of Zn and Mg, or alloy thereof.

In addition, an InAlAsP/InGaAsP compound semiconductor laser typically for use in transponders for submarine optical fiber cables, of which specifications such as crystal defect density or the like are very strictly regulated in order to realize a high output and an high durability.

In all of these devices, semiconductor layers composing the light emitting layer portion are formed by a vapor-phase epitaxy process such as sputtering, molecular beam epitaxy (MBE) or metal organic vapor phase epitaxy (MOVPE).

There is a problem that oxide layers of Zn and Mg are very likely to cause oxygen deficiency, and they inevitably tend to have an n-type conductivity, so that it is intrinsically difficult to obtain the crystal having only a less amount of n-type carrier (electrons) as a conductive carrier. Nevertheless, in the fabrication of the electronic devices disclosed in the above-described patent publications, it is essentially necessary to form oxide layers of Zn and Mg having a p-type conductivity. These oxide crystals, however, tend to have an n-type conductivity due to oxygen deficiency as described in the above, and it has long been believed as very difficult to form the p-type crystal or non-doped, semi-insulating crystal used for the active layer. One possible method may be such as adding p-type dopant, but conversion of an n-type conductivity of a material into a p-type conductivity needs a large amount of dopants in order to compensate the whole portion of the existing n-type carriers and to excessively generate p-type carriers, so that problems in stability, reproducibility and uniformity of the electric characteristics remain unsolved.

Even for the case where the light emitting device is to be fabricated by a vapor-phase epitaxy process using any compound semiconductors other than the oxides of Zn and Mg (referred to as ZnO-base oxide or MgZnO-base oxide, hereinafter), only a tiny crystal defect ascribable to variation in reaction efficiency of the source gases may cause failure especially in the aforementioned InAlAsP/InGaAsP compound semiconductor laser, for which a very high level of quality is required, and may considerably lower the production yield.

ZnO-base oxide can be obtained by a vapor-phase epitaxy in a vacuum environment, where heteroepitaxial growth process using a substrate of a different origin, such as sapphire, is unconditionally adopted because of difficulty in bulk single crystal growth. It is therefore necessary to interpose an appropriate buffer layer between the substrate and the light emitting layer portion in order to attain a desirable crystallinity of the light emitting layer portion as described in the above. The aforementioned Japanese Laid-Open Patent Publication No. 2001-44500 discloses a method in which the buffer layer (contact layer) is formed by MBE (Molecular Beam Epitaxy) process or MOVPE (Metalorganic Vapour Phase Epitaxy) process similarly to the light emitting layer to be formed in succession.

The MBE process, however, cannot readily suppress generation of the oxygen deficiency due to its low pressure in the growth atmosphere, so that it is very difficult for the process to form the ZnO-base oxide layer which is indispensable for composing the light emitting device. On the other hand, the MOVPE process can arbitrarily vary partial pressure of oxygen during the growth, and thus can suppress generation of the oxygen elimination or oxygen deficiency by raising the atmospheric pressure to some extent. In the MOVPE process generally proceeded in a continuous manner, even if any accidental irregularity such as deficiency or dislocation of the atoms should occur, the layer growth for the next layer and thereafter continuously proceed while leaving the irregularity unrepaired, so that the process could not always ensure a desirable quality of the buffer layer which governs the crystal quality of the light emitting layer portion, and this has consequently been making it difficult to obtain the device having an excellent light emission efficiency.

The aforementioned ZnO-base oxide will have a larger band gap energy as alloy composition x of MgO (magnesium oxide) to ZnO (zinc oxide) increases. For the case where the ZnO-base semiconductor light emitting device, which comprises an MgZnO-type oxide, is configured based on the double heterostructure, it is therefore a general practice to compose the active layer with ZnO in view of ensuring more effective confinement of carriers injected thereto. The MgZnO-type oxide can be formed by the MOVPE process or MBE process as described in the above, but the formation process thereof is highly causative of oxygen deficiency of the MgZnO-type oxide and can readily result in degradation of crystallinity of the active layer composed of ZnO. This consequently expands total half value width of the emission wavelength range ascribable to the active layer, reduces the emission intensity, and suppresses the emission efficiency for specific wavelength to be desired.

A first subject of the invention is, therefore, to provide a method of fabricating a light emitting device having a ZnO-base oxide layer, capable of growing the p-type oxide layer in a reproducible and stable manner.

A second subject of the invention is to provide a method of fabricating a light emitting device capable of drastically raising reaction efficiency of the source gases when the semiconductor layer composing the light emitting layer portion is formed by a vapor-phase epitaxy process, and of readily realizing semiconductor layers having a conductivity type which have not conventionally been obtainable, and having only a less amount of crystal defects and being high in quality.

A third subject of the invention is to provide a method of fabricating a light emitting device capable of realizing a high-quality, light emitting layer portion composed of a ZnO-base oxide, and to provide also a light emitting device obtainable by the method.

A fourth subject of the invention is to provide a light emitting device using a ZnO-base oxide, of which active layer can be formed with a high quality in an exact manner, and is further to provide a high-performance, blue-color light emitting device at low costs.

DISCLOSURE OF THE INVENTION (First Invention)

A first invention is to solve the aforementioned first subject, and is to provide a method of fabricating a light emitting device having a light emitting layer portion which includes a p-type $Mg_xZn_{1-x}O$ (where, $0 \leq x \leq 1$) layer, wherein the p-type $Mg_xZn_{1-x}O$ layer is grown by a metal organic vapor-phase epitaxy process while supplying organometallic gases, an oxygen component source gas and a p-type dopant gas into a reaction vessel, and is annealed during and/or after completion of the growth thereof in an oxygen-containing atmosphere.

In the first invention, the p-type $Mg_xZn_{1-x}O$ layer grown by a metal organic vapor-phase epitaxy process is annealed in the oxygen-containing atmosphere during and/or after completion of the growth. This effectively prevents the oxygen deficiency from occurring, and successfully obtains a crystal having a less amount of n-type carrier. It is therefore no more necessary to add an excessive amount of p-type dopant for compensating the n-type carrier, and this makes it possible to obtain the light emitting device containing the p-type $Mg_xZn_{1-x}O$ layer, excellent in the stability, reproducibility and uniformity in the electrical characteristics.

In order to obtain a high-luminance, light emitting device, it is effective to compose the light emitting layer portion so as to have a double heterostructure as described in the next. That is, the light emitting layer portion is configured so as to have a structure in which an n-type cladding layer, an active layer, and a p-type $Mg_xZn_{1-x}O$ (where, $0 \leq x \leq 1$) layer are stacked in this order. The method of fabricating a light emitting device according to the first invention herein characteristically comprises:

an n-type cladding layer growing step for growing the n-type cladding layer; and an active layer growing step for growing the active layer; and a p-type cladding layer growing step for growing the p-type cladding layer by a metal organic vapor-phase epitaxy process while supplying organometallic gases, an oxygen component source gas and a p-type dopant gas into a reaction vessel, and annealing the p-type cladding layer during and/or after completion of the growth thereof in an oxygen-containing atmosphere. This method is successful in realizing, a device showing high emission intensity specific to the double heterostructure.

The light emitting layer portion can be configured so that the n-type cladding layer composed of an n-type $Mg_zZn_{1-z}O$ (where, $0 \leq z \leq 1$) layer, the active layer composed of a $Mg_yZn_{1-y}O$ (where, $0 \leq y < 1$, $x > y$) layer, and the p-type cladding layer composed of a p-type $Mg_xZn_{1-x}O$ (where, $0 \leq x \leq 1$) layer are stacked in this order. In the n-type cladding layer formation step herein, organometallic gases and an oxygen component source gas are supplied into the reaction vessel so as to allow the n-type cladding layer to grow on the substrate based on a metal organic vapor-phase epitaxy process. The active layer growing step herein is a step for growing the active layer on a substrate by a metal organic vapor-phase epitaxy process while supplying organometallic gases and an oxygen component source gas into the reaction vessel, and includes a step for annealing the layer during and/or after completion of the growth thereof in an oxygen-containing atmosphere.

In the above-described method in which the active layer composed of the $Mg_yZn_{1-y}O$ layer and the p-type cladding layer composed of the p-type $Mg_xZn_{1-x}O$ layer are formed by the metal organic vapor phase epitaxy process, the annealing carried out during and/or after completion of the growth of these layers can effectively prevent the oxygen deficiency from occurring within the layers, and is successful in readily obtaining the crystal having only a less amount of n-type carrier. It is therefore no more necessary for the p-type cladding layer to be added with an excessive amount of p-type dopant for compensating the n-type carrier, and it is made possible for the active layer to suppress the carrier concentration and to raise the emission recombination efficiency. This is also advantageous in that it can largely reduce the costs, because all layers composing the light emitting layer portion can be composed using the inexpensive MgZnO-base oxide material. On the other hand, the growth process for the n-type cladding layer does not adopt the aforementioned annealing to thereby intentionally produce the oxygen deficiency (note that a composite oxide obtained by partially replacing Zn in ZnO with Mg is occasionally abbreviated as MgZnO in the description below, this by no means indicates a condition of Mg:Zn:O=1:1:1, where the same will apply also to the second to fourth inventions).

It is now preferable to suppress the oxygen deficiency concentration in the p-type MgZnO layer or MgZnO active layer to as low as 10 sites/cm³ or below (0 site/cm³ not precluded). In this case, it is very difficult for RF sputtering and molecular beam epitaxy (MBE) to suppress generation of the oxygen deficiency, since pressure in the growth atmosphere in these processes are as low as $10^{-4}$ Torr to $10^{-2}$ Torr ($1.3332 \times 10^{-2}$ Pa to 1.3332 Pa), so that it is substantially impossible for these methods to grow the p-type MgZnO layer. On the contrary, a vapor-phase epitaxy process based on the MOVPE process can arbitrarily vary oxygen partial pressure during the growth, and thus can suppress generation of the oxygen elimination or oxygen deficiency by raising the atmospheric pressure to some extent.

When the annealing for suppressing generation of oxygen deficiency is carried out, it is preferable to reduce as possible the amount of supply of the organometallic gases than the amount of supply adopted for the case where the layer growth is a matter of preference, and it is more preferable to interrupt the supply, in view of suppressing generation of the oxygen deficiency in the layers. The oxygen-containing atmosphere during the annealing can be created by introducing the oxygen component source gas (same as that used for the layer growth based on the MOVPE process) into the reaction vessel, which is efficient because the annealing can be completed within the same reaction vessels used for the layer growth.

The annealing may be carried out after completion of the layer growth, but it may be difficult for the annealing after the completion to fully remove the oxygen deficiency which remains deep inside the layer if the oxygen deficiency is accidentally formed in the process of the layer growth. It is therefore effective to carry out the annealing during the layer growth, and more preferably to alternatively repeat the intermittent layer growth and the annealing in the oxygen-containing atmosphere for the purpose of more effective suppression of the oxygen deficiency. In this case, the aforementioned repetition of the intermittent layer growth and annealing will be more efficient if the layer to be annealed is grown while continuously supplying the oxygen component source gas and intermittently interrupting supply of the organometallic gases, to thereby make use of the time duration of interrupted supply of the organometallic gases as an effective duration of the annealing.

Next, the annealing for suppressing the oxygen deficiency for the p-type MgZnO layer or the MgZnO active layer must be carried out in the oxygen-containing atmosphere having an oxygen partial pressure higher than dissociation oxygen pressure of MgZnO (where, oxygen-containing molecules other than $O_2$ are to be included after converting the component oxygen into $O_2$). In an atmosphere having an oxygen partial pressure lower than the dissociation oxygen pressure of MgZnO, it is impossible to prevent the oxygen deficiency from occurring due to promoted decomposition of MgZnO. The oxygen partial pressure adaptable to the annealing is more preferably 1 Torr (133.32 Pa) or above. While there is no special limitations on the upper limit of the oxygen partial pressure, the pressure is preferably set within a range not causative of unnecessary rise in costs of the annealing facility (typically set at 7,600 (1.013 MPa) Torr or around for the annealing in the reaction vessel).

(Second Invention)

A second invention is to solve the aforementioned second subject, and is to provide a method of fabricating a light emitting device having a step of growing a semiconductor layer for composing a light emitting layer portion in vapor phase by introducing source gases in a reaction vessel having a substrate disposed therein, and by allowing a semiconductor material generated based on chemical reactions of the source gases to deposit on the main surface of the substrate, wherein a vapor-phase epitaxy process of the semiconductor layer is proceeded while irradiating ultraviolet light to the source gases introduced in the reaction vessel.

Because the chemical reactions for producing the semiconductor material from the source gases is promoted by ultraviolet irradiation in the second invention, the semiconductor material will be less causative of crystal defects or the like during deposition on the main surface of the substrate, and will readily realize the semiconductor layer having only a less amount of crystal defects.

In the production of the semiconductor material through the chemical reactions of the source gases, a reaction system containing the source gases needs be transferred into a reactive transition state having a high enthalpy. If the amount of energy required for causing transfer to the transition status is not supplied, unreacted or incompletely-reacted components of the source gases will increase components causing adsorption within the layer and will be causative of the crystal defects. Although the necessary energy might be supplemented by heat energy, this requires rise in the temperature of the system. An excessive rise in the temperature of the substrate however ruin adsorption ratio of the semiconductor material contributable to the crystal growth, and undesirably results in formation of the layers only having a large amount of crystal defects. In contrast, combined use of the ultraviolet irradiation described in the above is successful in securing a necessary and enough energy for completing the generation reactions of the semiconductor material without excessively raising the temperature of the system, and in forming the semiconductor layer having only a less amount of crystal defects.

In this case, one possible system is such as having a ultraviolet light source disposed so as to oppose with the main surface of the substrate, in which the source gases are supplied between the substrate and the ultraviolet light source while irradiating ultraviolet light towards the main surface. This is successful in selectively accelerating the generation reactions of the semiconductor material from the source gases in the vicinity of the main surface of the substrate. Ultraviolet light irradiated to the substrate is once absorbed by the substrate, and can highly activate the outermost portion of the layers under growth based on the light excitation effect. More specifically, it is supposed that a highly activated status similar to that obtainable by the layer growth under a high temperature is locally realized in the outermost portion of the layers, and this makes it possible to efficiently proceed the layer growth while suppressing thermal decomposition of the source gas components in the vapor phase.

In one rational method of irradiating ultraviolet light to the source gases or the substrate in the reaction vessel, a part of the wall portion of the reaction vessel opposing to the main surface of the substrate is configured as a transparent wall portion, the ultraviolet light source is disposed outside the reaction vessel, and ultraviolet light from the ultraviolet light source is irradiated towards the main surface through the transparent wall portion. According to this configuration, the ultraviolet light source can be disposed outside the reaction vessel, and this prevents the light source per se from being adversely affected by corrosion or deposited reaction products, and elongates the service life of the apparatus.

Although any vapor-phase epitaxy processes may be applicable so far as they can correlate the chemical reactions to the layer growth, a metal organic vapor-phase epitaxy (MOVPE) process is particularly preferable because of its potential of efficiently growing a high-quality oxide semiconductor or compound semiconductor. While the MBE process is one possible method other than the MOVPE process, the MOVPE process can more advantageously be adopted to the formation of the oxide semiconductor layer described below because it is more unlikely cause the oxygen deficiency.

In a metal organic vapor-phase epitaxy process, the semiconductor layer composed of the metal oxide can be formed by using organometallic gases and an oxygen component source gas as the source gases, based on chemical reactions of the organometallic gases with the oxygen component source gas. In the formation of the oxide semiconductor, any unreacted or incompletely-reacted oxygen component source gas incorporated into the layer by adhesion will be causative of the oxygen deficiency after elimination of the component. The oxygen deficiency emits an electron as a carrier, and thus inevitably makes the conductivity type of the resultant layer n-type. This is a serious non-conformity in formation of p-type layer or insulating (non-doped) layer indispensable for forming the light emitting layer portion. Adoption of the second invention herein is successful in effectively suppressing generation of the oxygen deficiency. The oxide semiconductor layer thus formed is exemplified by $Mg_xZn_{1-x}O$ (where, $0 \leq x \leq 1$) layer. Use of the $Mg_xZn_{1-x}O$ layer makes it possible to readily form a light emitting device capable of ensuring high luminance light emission in the blue light region or ultraviolet region.

Adoption of the second invention is successful in effectively suppressing the oxygen deficiency, and is consequently successful in readily obtaining the crystal having only a less amount of n-type carrier. It is therefore no more necessary to add an excessive amount of p-type dopant for compensating the n-type carrier, and this makes it possible to obtain the light emitting device containing the p-type $Mg_xZn_{1-x}O$ layer, excellent in the stability, reproducibility and uniformity in the electrical characteristics.

More specifically, the light emitting layer portion can be configured so as to have a double heterostructure in which the n-type cladding layer composed of an n-type $Mg_zZn_{1-z}O$ (where, $0 \leq z \leq 1$) layer, the active layer composed of a $Mg_yZn_{1-y}O$ (where, $0 \leq y < 1$, x>y) layer, and the p-type cladding layer composed of a p-type $Mg_xZn_{1-x}O$ (where, $0 \leq x \leq 1$) layer are stacked in this order. In this case, the n-type cladding layer can readily be formed by supplying the organometallic gases and an oxygen component source gas into the reaction vessel, without specifically irradiating ultraviolet light. The active layer can be formed by supplying the organometallic gasses and an oxygen component source gas into the reaction vessel with irradiating ultraviolet light. The p-type cladding layer can be formed by additionally supplying a p-type dopant gas in the process similar to that for the active layer.

Also in the second invention, it is preferable to suppress the oxygen deficiency concentration in the p-type MgZnO layer or MgZnO active layer to as low as 10 sites/cm$^3$ or below (0 site/cm$^3$ not precluded), and a vapor-phase epitaxy process based on the MOVPE process is preferable in view of suppressing the oxygen deficiency.

The second invention is also applicable to fabrication of compound semiconductor light emitting devices other than those using the MgZnO-base oxide, such as InAlAsP/InGaAsP compound semiconductor light emitting device (laser device, in particular).

(Third Invention)

A third invention is to solve the aforementioned third subject, and includes a method of fabricating a light emitting device and thus-fabricated, light emitting device. The method of fabricating a light emitting device of the third invention is such as fabricating a light emitting device having a light emitting layer portion composed of an $Mg_aZn_{1-a}O$-type (where, $0 \leq a \leq 1$) oxide, wherein a buffer layer is formed on a substrate, the buffer layer having at least an $Mg_aZn_{1-a}O$-type oxide layer on the contact side with the light emitting layer portion, and the light emitting layer portion is grown on the buffer layer;

the $Mg_aZn_{1-a}O$-type oxide layer has wurtzite crystal structure in which metal atom layers and oxygen atom layers are alternatively stacked in the direction of the c-axis, the buffer layer is grown so as to orient the c-axis of the wurtzite crystal structure to the thickness-wise direction, and so as to form a metal atom layer as a metal monoatomic layer on the substrate by the atomic layer epitaxy, and then to form the residual oxygen atom layers and metal atom layers.

The light emitting device of the third invention is such as having a light emitting layer portion composed of an $Mg_aZn_{1-a}O$-type (where, $0 \leq a \leq 1$) oxide and formed on a substrate, and having a buffer layer formed between the substrate and the light emitting layer portion, the buffer layer having at least an $Mg_aZn_{1-a}O$-type oxide layer on the contact side with the light emitting layer portion;

the $Mg_aZn_{1-a}O$-type oxide layer has wurtzite crystal structure in which metal atom layers and oxygen atom layers are alternatively stacked in the direction of the c-axis; and the buffer layer has the c-axis of the wurtzite crystal structure oriented to the thickness-wise direction, has a single atom layer portion as a metal monoatomic layer formed in contact with the substrate, and has the residual oxygen atom layers and metal atom layers alternatively stacked successive to the metal monoatomic layer.

In the third invention, the entire portion or at least a portion on the contact side with the light emitting layer portion of the buffer layer formed on the substrate is composed of an $Mg_aZn_{1-a}O$-type oxide (where, alloy composition a is not always same with that of the light emitting layer portion, and the oxide may occasionally be referred to as MgZnO-type oxide or simply as MgZnO, while omitting indication of the alloy composition a). Because the portion on the junction interface side of the buffer layer and the light emitting layer portion have basically the same crystal structure (wurtzite crystal structure) and the same component system, local irregularity of the crystal structure due to interaction between the components over the junction interface becomes less likely to occur, and this is advantageous in realizing the light emitting layer portion having a desirable crystallinity. Typically the entire portion of the buffer layer may be composed of the MgZnO-type oxide. This makes it possible to carry out a vapor-phase epitaxy process of the buffer layer and light emitting layer portion in the same facility in an extremely simple manner.

In the third invention, the buffer layer is formed particularly so as to form a metal atom layer as a metal monoatomic layer on the substrate by the atomic layer epitaxy (ALE) process, and then to form the residual oxygen atom layers and metal atom layers. By adopting the ALE process, formation of the metal atom layer can be saturated once a single atomic layer is completed (so-called, self-termination function), and the atoms arranged in the layer are less likely to cause any irregularity such as deficiency or dislocation. By forming a single layer of the less-irregular metal atom layer and then forming the succeeding metal atomic layers and oxygen atom layers, it is made possible to obtain the buffer layer having an excellent crystallinity. This consequently improves the crystallinity of the light emitting layer portion formed thereon, and is advantageous in realizing a high-performance, light emitting device. By adopting the above-described method, the light emitting device of the third invention will have the c-axis of the wurtzite crystal structure oriented to the thickness-wise direction, will have the single atom layer portion in contact with the substrate formed as a metal monoatomic layer, and will have the residual oxygen atom layers and metal atom layers alternatively formed in succession to the metal monoatomic layer. Thus-configured buffer layer has an excellent crystallinity, and this makes it possible to realize the light emitting layer portion having only a less amount of defects and irregularity, and having a desirable emission efficiency.

The ALE process can be carried out in a form of a metal organic vapor-phase epitaxy (MOVPE) process in which an organometallic compound gas and an oxygen component source gas are supplied in a reaction vessel having a substrate disposed therein. More specifically, only an organometallic compound gas, which serves as a source material for the metal atom layer, is allowed to flow through the reaction vessel to thereby form the first metal atom layer for composing the buffer layer so as to be saturated by a single atom layer, to thereby form a metal monoatomic layer. As shown in FIG. 16A, organometallic compound (MO) molecule causes decomposition or elimination of organic groups bound thereto, and allows its metal atom to chemically adsorb onto the substrate. Under the ALE process, the metal atom is adsorbed while keeping a part of its organic groups unremoved, and as shown in FIG. 16B, forms the metal atom layer so as to orient the residual organic group towards the upper surface. Once the first single atomic layer is completed, thus-oriented organic groups can inhibit adhesion of newly-coming metal atoms and can fully exhibit the self-termination function, so that the atoms arranged in the layer will become very unlikely to cause irregularities such as deficiency and dislocation.

In the MOVPE process, oxygen partial pressure during the growth can arbitrarily be varied, so that generation of the oxygen elimination or oxygen deficiency is effectively avoidable by raising the atmospheric pressure to some extent. This consequently makes it possible to form the p-type $Mg_aZn_{1-a}O$ layer indispensable for the light emitting device, in particular the p-type $Mg_aZn_{1-a}O$ layer such as having a density of oxygen deficiency of as small as 10 sites/cm$^3$ or below. The smaller density of oxygen deficiency is the better (that is, 0 site/cm$^3$ not precluded).

When the MOVPE process is adopted, composition of the entire portion of the buffer layer using MgZnO-type oxide is advantageous, because the buffer layer and light emitting layer portion can be grown sequentially in the same reaction vessel only by adjusting ratio of the organometallic gasses and oxygen component source gas. This is also advantageous in that the purging of the vessel between growth processes for the buffer layer and light emitting layer portion needs only a short time as compared with the case where the buffer layer is formed using different materials such as GaN, or the purging per se is omissible.

Also in the third invention, it is effective to grow the light emitting layer portion so as to have a double heterostructure as described below, in order to obtain a high-luminance, light emitting device. That is, the double heterostructured, light emitting layer portion is formed on the buffer layer by sequentially stacking a first-conductivity-type cladding layer (p-type or n-type) composed of $Mg_aZn_{1-a}O$-type oxide, an active layer, and a second-conductivity-type cladding layer (n-type or p-type) having a conductivity type different from that of the first-conductivity-type cladding layer, in this order.

(Fourth Invention)

A fourth invention is to provide a light emitting device for solving the fourth subject. The light emitting device has a double heterostructured, light emitting layer portion which comprises an active layer and cladding layers, wherein the active layer is composed of a Group II-VI compound semiconductor containing Zn as a Group II element, and containing O together with Se or Te as a Group VI element, and the cladding layers are composed of $Mg_xZn_{1-x}O$-type (where, $0 \leq x \leq 1$) oxide.

In the double hetero-type, ZnO-base semiconductor light emitting devices composed of an MgZnO-base oxide, those having the active layer composed of ZnO, having a band gap energy of 3.25 eV, causes light emission in near violet color. To adjust the band gap energy suitable for blue-color light emission, it is necessary to add some impurity to the ZnO active layer to thereby form impurity levels, or to configure the active layer using a ZnO-base alloyed compound semiconductor having a smaller band gap energy than ZnO has.

To achieve blue-color light emission with high emission efficiency, it is necessary for the active layer to satisfy the above-described constitutional conditions, and to stabilize the crystallinity. In view of stabilizing the crystallinity of the active layer composed of a ZnO-base semiconductor mainly containing ZnO, an essential point resides in that how successfully the oxygen deficiency can be suppressed when the active layer is stacked by epitaxially growing the ZnO-base semiconductor typically based on the MOVPE or MBE process.

The active layer in the fourth invention is formed using Group II-VI compound semiconductor (aforementioned ZnO-base semiconductor) containing Zn (zinc) as a Group II element, and containing O (oxygen) together with Se (selenium) or Te (tellurium) as a Group VI element, and this makes it possible to introduce Se or Te, which belongs to the same Group with oxygen, into the oxygen-deficient sites. For the case where the introduced Se or Te acts as an impurity, Zn—Se pair or Zn—Te pair is supposed to form a deeper impurity level than ZnO forms, so that blue-color light emission with a higher efficiency than that given by ZnO-base semiconductor can be obtained.

In the active layer composed of ZnO-base semiconductor, Se or Te introduced into the oxygen-deficient sites may not exist in a form of impurity, but may form a local crystal structure of ZnOSe or ZnOTe which is different from ZnO. Both of the ZnOSe crystal and ZnOTe crystal have smaller band gap energies as compared with that of ZnO crystal, and can form the active layer capable of blue-color light emission at a higher efficiency. The emission possibly obtained via the impurity levels results in saturation of effect of improving the emission efficiency due to a limited range of formation of Zn—Se pair or Zn—Te pair which is causative of the impurity levels. On the other hand, the emission possibly obtained via the bands formed by the ZnOSe crystal or ZnOTe crystal results in further increase in the emission efficiency.

The double heterostructure adopted for the light emitting device of the fourth invention is such as having the active layer, which is composed of the aforementioned Se- or Te-containing, ZnO-base semiconductor, sandwiched between the cladding layers which are composed of $Mg_xZn_{1-x}O$-type ($0 \leq x \leq 1$) oxide having a band gap energy larger than that of the active layer. The $Mg_xZn_{1-x}O$-type ($0 \leq x \leq 1$) oxide will have a larger band gap energy as MgO alloy composition x increases, but will also have a larger insulating property. Increase in MgO alloy composition x, therefore, makes it difficult to dope an effective number of carriers into the cladding layer. It is in particular difficult for ZnO, having an n-type conductivity in a non-doped status, to form the p-type cladding layer which should be doped with p-type carriers. In contrast to that the active layer has been formed by using ZnO, the active layer in the fourth invention is formed by using the Se- or Te-containing, ZnO-base semiconductor having a band gap energy smaller than that of ZnO, so that it is made possible to configure the cladding layer using the $Mg_xZn_{1-x}O$-base oxide of which ZnO or MgO alloy composition x is suppressed to a low level. This consequently makes it possible to dope an effective number of carriers into the cladding layer, to dope an effective number of carriers also into the active layer, and to improve the emission efficiency.

When the active layer is composed of ZnOSe crystal or ZnOTe crystal, the ZnOSe crystal or ZnOTe crystal will have a smaller band gap energy as the ratio of Se or Te to O increases, and thus the emission wavelength becomes shorter. A band gap energy suitable for blue-color light emission falls within a range from 2.52 to 3.15 eV, where the largest band gap energy of 3.15 eV suitable for blue-color light emission can be attained typically by adjusting a ratio of O and Se to 61:39 for the ZnOSe crystal, and by adjusting a ratio of O and Te to 81:19 for the ZnOTe crystal. Because ZnO has a band gap energy of 3.25 eV, the cladding layer can be formed by using ZnO without suppressing the carrier confinement effect in the active layer. By composing the cladding layer with ZnO, the cladding layer and active layer will have ZnO as a major constituent thereof, and this not only makes it possible to improve working efficiency in the fabrication, but also makes it unnecessary to use excessive Mg, and contributes to cost reduction.

Beside the above-described blue-color light emission, it is also possible to obtain band gap energy suitable for emission at longer wavelength regions such as blue-green to green regions, by adjusting ratio of Se and Te to O in the ZnOSe crystal or ZnOTe crystal. Since the band gap energy of the active layer in this case is smaller than that suitable for blue-color light emission, the cladding layer can be composed by using ZnO.

The active layer of the ZnO-base semiconductor light emitting device of the fourth invention can be configured as having a multi-layered structure in which sub-layers composed of ZnSe or ZnTe are inserted in a main layer composed of ZnO so as to be distributed over the thickness-wise direction.

As described in the above, when the active layer is formed by epitaxially growing ZnO-base semiconductor, crystallinity of the active layer can be improved by introducing Se or Te, which belongs to the same Group with oxygen, to oxygen-deficient sites. It is also possible to shift the emission wavelength of the active layer to the longer wavelength region. While the active layer may be configured as a single layer composed of Se- or Te-containing ZnO-base semiconductor, adoption of the above-described, multi-layered structure, which is typified by a structure in which the sub-layers composed of ZnSe or ZnTe, and having a width not larger than that of a unimolecular layer of the active layer, are inserted in a main layer composed of ZnO, ensures the effects described in the next. Thus-formed sub-layer can function as a δ doped layer and can localize Se or Te in the thickness-wise direction, and this makes it possible to enhance effect of introducing Se or Te to the oxygen-deficient sites. This enhances binding tendency with Zn in the closest vicinity, and raises probability of forming Zn—Se pair or Zn—Te pair, or of forming ZnOSe crystal or ZeOTe crystal. Even if the devices are not introduced into the oxygen-deficient sites, it is made possible to prevent non-luminescent center caused by unmatched interface or dislocation, by suppressing formation of different crystal phases such as ZnSe and ZnTe. If the coverage ratio of the sub-layer is controlled so as to be smaller than a unimolecular layer of the active layer, Se or Te is successfully prevented from depositing as an impurity rather than being incorporated into the oxygen-deficient sites.

Because the number of layers of the sub-layers to be inserted into the active layer can properly be selected depending on the band gap energy, and more specifically on the ratio of Se or Te to O in the ZnOSe crystal or ZnOTe crystal for composing the active layer, and is not specifically limited. It is, however, preferable of course that effect of introduction of Se or Te can uniformly extend over the active layer in view of obtaining a uniform light emission therefrom. It is therefore preferable to form the sub-layers so as to be distributed over the thickness-wise direction, and typically in a periodical manner.

Other conditions commonly applicable to the first to fourth inventions will be described.

The growth of the p-type MgZnO layer or MgZnO active layer based on the MOVPE process can more advantageously be proceeded under an atmosphere conditioned at a pressure of 10 Torr (1.3332 kPa) or above, so as to more effectively suppress generation of the oxygen deficiency during the film formation, and to obtain the p-type MgZnO layer or MgZnO active layer having desirable characteristics. It is more preferable herein to adjust oxygen partial pressure (including any other oxygen-containing molecules other than $O_2$, after converting component oxygen to $O_2$) to 10 Torr (1.3332 kPa) or above. For the case where the n-type MgZnO layer is formed on the buffer layer, and further thereon the MgZnO active layer and p-type MgZnO layer is formed, any oxygen deficiencies generated in the n-type MgZnO may be causative of irregularity or the like in the MgZnO active layer and p-type MgZnO layer formed thereafter, so that it is preferable that also the n-type MgZnO layer is grown so as to suppress the oxygen deficiency as possible. In this case, the n-type MgZnO layer is added with an n-type dopant so as to have the conductivity type of n-type. On the other hand, for the case where the p-type MgZnO layer is formed on the buffer layer, and further thereon the MgZnO active layer and n-type MgZnO layer are formed, it is also allowable to intentionally form the oxygen deficiency in the n-type MgZnO layer so as to have an n-type conductivity.

To make $Mg_aZn_{1-a}O$ to have a p-type conductivity, it is necessary to add an appropriate p-type dopant as described in the above. As the p-type dopant, either one of, or two or more of N, Ga, Al, In, Li, Si, C, and Se are available. Among these, use of N is particularly preferable in view of obtaining desirable p-type characteristics. As the metal element dopant, either one of, or two or more of Ga, Al, In and Li are available, where Ga is particularly effective. Combined addition of these dopants with N can ensure desirable p-type characteristics in a more reliable manner.

To ensure sufficient emission characteristics, p-type carrier concentration in the p-type $Mg_aZn_{1-a}O$ layer preferably falls within a range from $1\times10^{16}$ sites/cm$^3$ to $8\times10^{18}$ sites/cm$^3$. The p-type carrier concentration less than $1\times10^{16}$ sites/cm$^3$ may make it difficult to obtain a sufficient emission luminance. On the other hand, the p-type carrier concentration exceeding $8\times10^{18}$ sites/cm$^3$ may excessively increase the amount of p-type carriers injected to the active layer, and this is causative of increase in p-type carrier not contributable to the light emission due to reverse diffusion into the p-type $Mg_aZn_{1-a}O$ layer, or injection into the n-type cladding layer after getting over the potential barrier, to thereby lower the emission efficiency. Also for the n-type $Mg_aZn_{1-a}O$ layer, it is preferable to adjust n-type carrier concentration within a range from $1\times10^{16}$ sites/cm$^3$ to $8\times10^{18}$ sites/cm$^3$ based on the same reason.

Examples of materials available for substrate include aluminum oxide, gallium oxide, magnesium oxide, gallium nitride, aluminum nitride, silicon, silicon carbide, gallium arsenide, indium-tin composite oxide and glass. Particularly preferable forms of the substrate include the followings. As shown in FIG. 2, $Mg_aZn_{1-a}O$-type oxide has wurtzite crystal structure comprising metal atom layers and oxygen atom layers alternatively stacked in the direction of c-axis, where the oxygen atoms follow a hexagonal atomic arrangement. The substrate is, therefore, preferably an oxide single crystal substrate in which oxygen atoms follow the hexagonal atomic arrangement, and the C-plane ((0001) plane) of the hexagonal atomic arrangement is exposed to the main surface, in terms of improving crystal matching with the buffer layer, and of obtaining the light emitting layer portion with a desirable crystallinity. In this case, the buffer layer is composed of the $Mg_aZn_{1-a}O$-type oxide over the entire portion thereof, and is formed on the main surface of the oxide single crystal substrate so as to orient the c-axis of its wurtzite crystal structure in the thickness-wise direction. Examples of such oxide single crystal substrate include those composed of corundum-structured oxide, where a sapphire substrate is one specific example thereof.

As shown in FIG. 15, in an oxide having corundum-type structure, a lattice of oxygen (O) atoms has a hexagonal atomic arrangement, and in the direction of c-axis thereof, O atom (ion) layers and metal atom (ion: shown as Al in the drawing) layers are alternatively stacked. In this crystal structure, one of both atomic layers appearing on both ends in the direction of c-axis will always be an oxygen atom layer plane, and the other will always be a metal atom layer plane. The O atom layer plane has the same O atomic arrangement with the O atom layer in the wurtzite crystal structure except for difference in the lattice constants. For the case where the main surface of the oxide single crystal substrate having such crystal structure will have formed thereon the buffer layer comprising $Mg_aZn_{1-a}O$-type oxide having the wurtzite crystal structure, a junction structure having better matching property can be obtained by stacking the metal atom layer of the buffer layer on the main surface of the substrate composing the O atom layer plane.

It is to be noted that it is also allowable to grow the light emitting layer portion on the A-plane of the sapphire substrate as disclosed in Japanese Laid-Open Patent Publication No. 2001-44500, and this is effective to a certain extent in terms of planarization of the crystal growth surface. Because the A-plane of the sapphire substrate has metal atoms and oxygen atoms exposed thereon in a mixed manner, the general continuous-growth-type MOVPE process may raise probability of causing adsorption of oxygen atoms and zinc atoms at the same time on the A-plane ((11-20) plane). This is more likely to cause irregularity in the stacking of the buffer layer grown based on the c-axis orientation, and is not always successful in obtaining a high-quality buffer layer and light emitting layer portion. Use of the ALE process, as in the third invention, is now successful in obtaining a high-quality buffer layer and, consequently, the light emitting layer portion in a highly reproducible manner, because the metal monoatomic layer can be formed also on the A-plane in a forced manner.

BEST MODE FOR CARRYING OUT THE INVENTION

Figure 1:
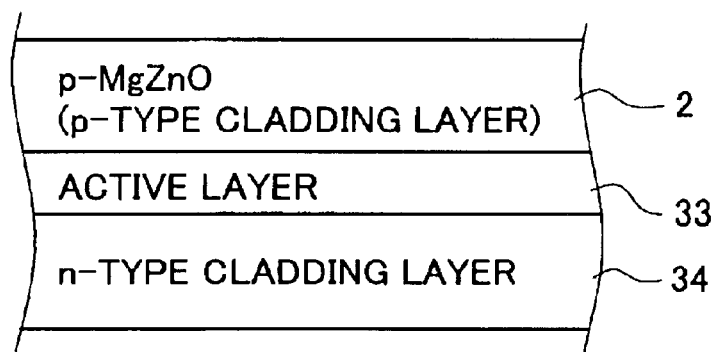
FIG. 1 is a conceptual drawing of a double heterostructured, light emitting layer portion including a p-type MgZnO layer.

Best modes for carrying out the invention will be explained referring to the drawings.

(Embodiment 1)

FIG. 1 is a drawing schematically showing a stacked structure of the essential portion of the light emitting device of the first invention, and the device has a light emitting layer portion in which an n-type cladding layer 34, an active layer 33 and a p-type cladding layer 2 are stacked in this order. The p-type cladding layer 2 is composed as a p-type $Mg_xZn_{1-x}O$ layer ($0 \leq x \leq 1$: may occasionally be referred to as p-type MgZnO layer 2, hereinafter). In the p-type MgZnO layer 2, a trace amount of either one of, or two or more of N, Ga, Al, In and Li, for example, are contained as a p-type dopant. The p-type carrier concentration is adjusted within a range from $1 \times 10^{16}$ sites/cm$^3$ to $8 \times 10^{18}$ sites/cm$^3$ as described in the above, and more specifically within a range from $10^{17}$ sites/cm$^3$ to $10^{18}$ sites/cm$^3$ or around.

Figure 2:
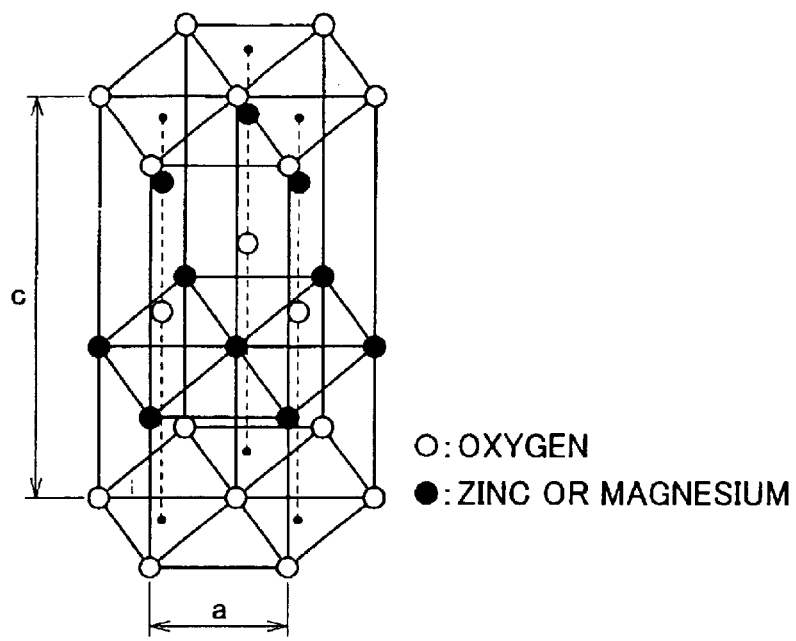
FIG. 2 is a schematic drawing of a crystal structure of MgZnO.
Figure 3:
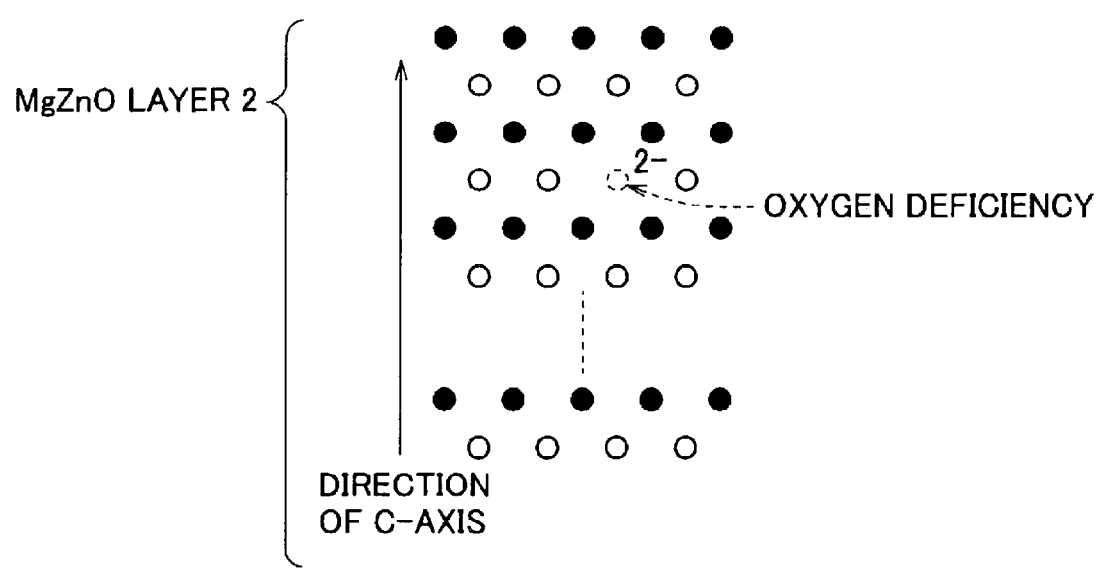
FIG. 3 is a schematic drawing of an arrangement of the metal ions and oxygen ions in the MgZnO layer.

FIG. 2 is a schematic drawing of a crystal structure of MgZnO, where so-called wurtzite structure is shown. In this structure, oxygen-ion-packed planes and metal-ion-(Zn ion or Mg ion) packed planes are stacked along the direction of the c-axis alternatively, and as shown in FIG. 3, the p-type MgZnO layer 2 is formed so as to align the c-axis thereof along the thickness-wise direction. Formation of a vacancy due to omission of an oxygen ion causes oxygen deficiency, and consequently produces electrons as n-type carriers. Excessive formation of such oxygen deficiency undesirably increases the n-type carriers, to thereby ruin p-type conductivity. It is therefore important that how completely the oxygen deficiency can be suppressed in order to form the p-type MgZnO layer.

The p-type MgZnO layer 2 can be formed by the MOVPE process. Principle of the MOVPE process per se is publicly known. The aforementioned p-type dopant is added during a vapor-phase epitaxy process. The p-type MgZnO layer 2 is annealed during or after completion of a vapor-phase epitaxy process in an oxygen-containing atmosphere. The annealing is successful in suppressing elimination of oxygen ions, and in obtaining a desirable p-type MgZnO layer 2 having only a small amount of oxygen deficiency. It is also effective to carry out the growth of the p-type MgZnO layer 2 under an atmospheric pressure of 10 Torr (1.3332 kPa) or above in terms of suppressing generation of the oxygen deficiency.

Now referring back to FIG. 1, the active layer 33 is composed of a material having an appropriate band gap depending on desired emission wavelength. For example, for those available for visible light emission, materials having band gap energies $E_g$ (3.10 eV to 2.18 eV or around), capable of causing light emission in a wavelength range of 400 nm to 570 nm, are selected. Although this range covers emission wavelength from violet region to green region, those having band gap energies $E_g$ (2.76 eV to 2.48 eV or around) capable of causing light emission in a wavelength range of 450 to 500 nm are selected in particular for the case where blue-color light emission is desired. On the other hand, those having band gap energies $E_g$ (4.43 eV to 3.10 eV or around) capable of causing light emission in a wavelength range of 280 nm to 400 nm are selected in particular for the case where ultraviolet emission is desired.

Figure 4:
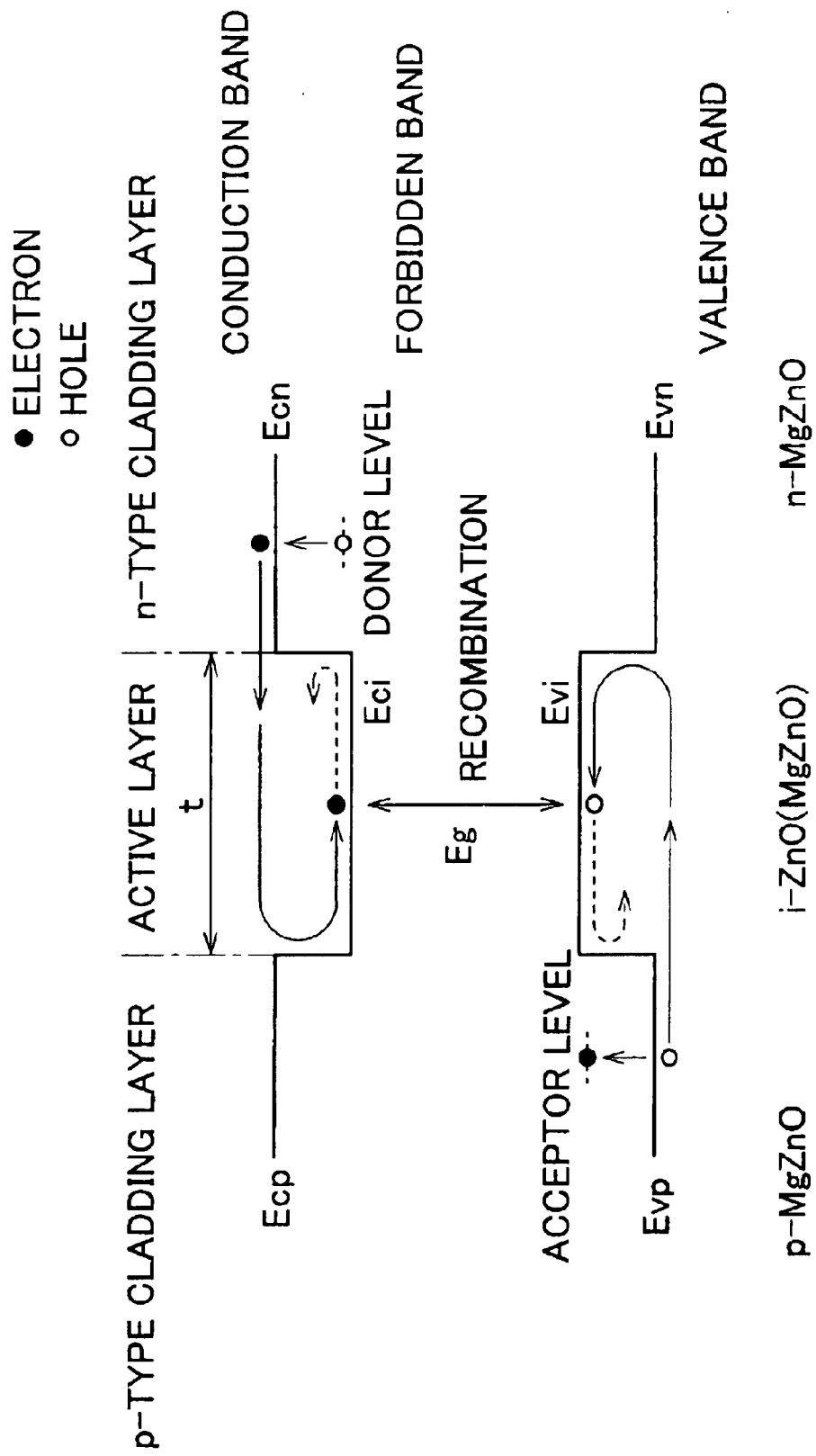
FIG. 4 is a schematic band chart of a light emitting device using a junction structure of Type-I band lineup.

The active layer 33 can be formed typically using a semiconductor capable of forming a Type-I band lineup between itself and the p-type MgZnO layer. An example of such active layer 33 is an $Mg_yZn_{1-y}O$ layer (where, $0 \leq y < 1$, x>y: referred to as MgZnO active layer, hereinafter). It is to be noted now that "a Type-I band lineup is formed between the active layer and the p-type MgZnO layer" means a junction structure, as shown in FIG. 4, in which the individual energy levels of the bottom of the conduction band and the upper end of the valence band $E_{cp}$, $E_{vp}$ of the p-type cladding layer (p-type MgZnO layer 2), and the individual energy levels of the bottom of the conduction band and the upper end of the valance band $E_{ci}$, $E_{vi}$ of the active layer satisfy the following relations of inequality:

$$E_{ci} < E_{cp} \quad (1)$$

$$E_{vi} > E_{vp} \quad (2)$$

In this structure, specific barrier will appear for both of the forward diffusion of holes from the active layer 33 to the n-type cladding layer 34, and the forward diffusion of electrons (n-type carriers) to the p-type cladding layer 2. If the material for the n-type cladding layer 34 is appropriately selected so as to form Type-I band lineup between the active layer 33 and the n-type cladding layer 34, similarly to as shown in FIG. 4, the active layer will have formed therein well-formed potential barriers both at the bottom of the conduction band and the upper end of the valence band, and will enhance confinement effect both for electrons and holes. This consequently results in more enhanced effects of promoting carrier recombination and of improving emission efficiency. While AlGaN or the like is available for the n-type cladding layer 34, n-type $Mg_zZn_{1-z}O$ layer (where $0 \leq z \leq 1$: occasionally also referred to as n-type MgZnO layer", hereinafter) is more advantageous, because this makes it possible to form all layers composing the light emitting layer portion with MgZnO-base oxide material (such light emitting layer portion will be referred to as "full-oxide-type, light emitting layer portion, hereinafter), so that it is no more necessary to use rare metals such as above-described Ga and In (dopants excluded), which contributes to a considerable cost reduction. Height of the potential barriers on both sides of the active layer can be equalized by making the alloy compositions of the n-type MgZnO layer 34 and the p-type MgZnO identical. Thickness t of the active layer 33 is selected so as to avoid decrease in the carrier density in the active layer 33 and excessive increase in the amount of carriers passing through the active layer 33 based on the tunneling effect, and is typically adjusted within a range from 30 nm to 1,000 nm.

In the MgZnO active layer 33, a value of alloy composition y can also serve as a factor which determines band gap energy $E_g$. For example, the value is selected in a range of $0 \leq y \leq 0.5$ for the case where ultraviolet emission over a wavelength of 280 nm to 400 nm is desired. The potential barrier height thus formed is preferably 0.1 eV to 0.3 eV or around for light emitting diode, and 0.25 eV to 0.5 eV or around for semiconductor laser light source. This value can be determined by selecting the alloy compositions x, y and z of the p-type $Mg_xZn_{1-x}O$ layer 2, $Mg_yZn_{1-y}O$ active layer 33, and n-type $Mg_zZn_{1-z}O$ layer 34.

The following paragraphs will describe one exemplary process for fabricating the light emitting device having the aforementioned full-oxide-type, light emitting layer portion. First, as shown in (a) of FIG. 6, a GaN buffer layer 11 is epitaxially grown on a sapphire substrate 10, and a p-type MgZnO layer 52 (typically of 50 nm thick), an MgZnO active layer 53 (typically of 30 nm thick), and an n-type MgZnO layer 54 (typically of 50 nm thick) are formed in this order (inverted order of the growth also acceptable). The epitaxial growth of the individual layers can be carried out by the MOVPE process as described in the above. It is to be noted that, MBE in the context of this specification include not only MBE in a narrow sense in which both of a metal element component source and a non-metal element component source are used in solid forms, but also include MOMBE (Metal Organic Molecular Beam Epitaxy) using the metal element component source in a form of organometallic compound and the non-metal element component source in a solid form; gas source MBE using the metal element component source in a solid form and the non-metal element component in a gas form; and chemical beam epitaxy (CBE) using the metal element component source in a form of organometallic compound and the non-metal element component source in a gas form.

Figure 5A:
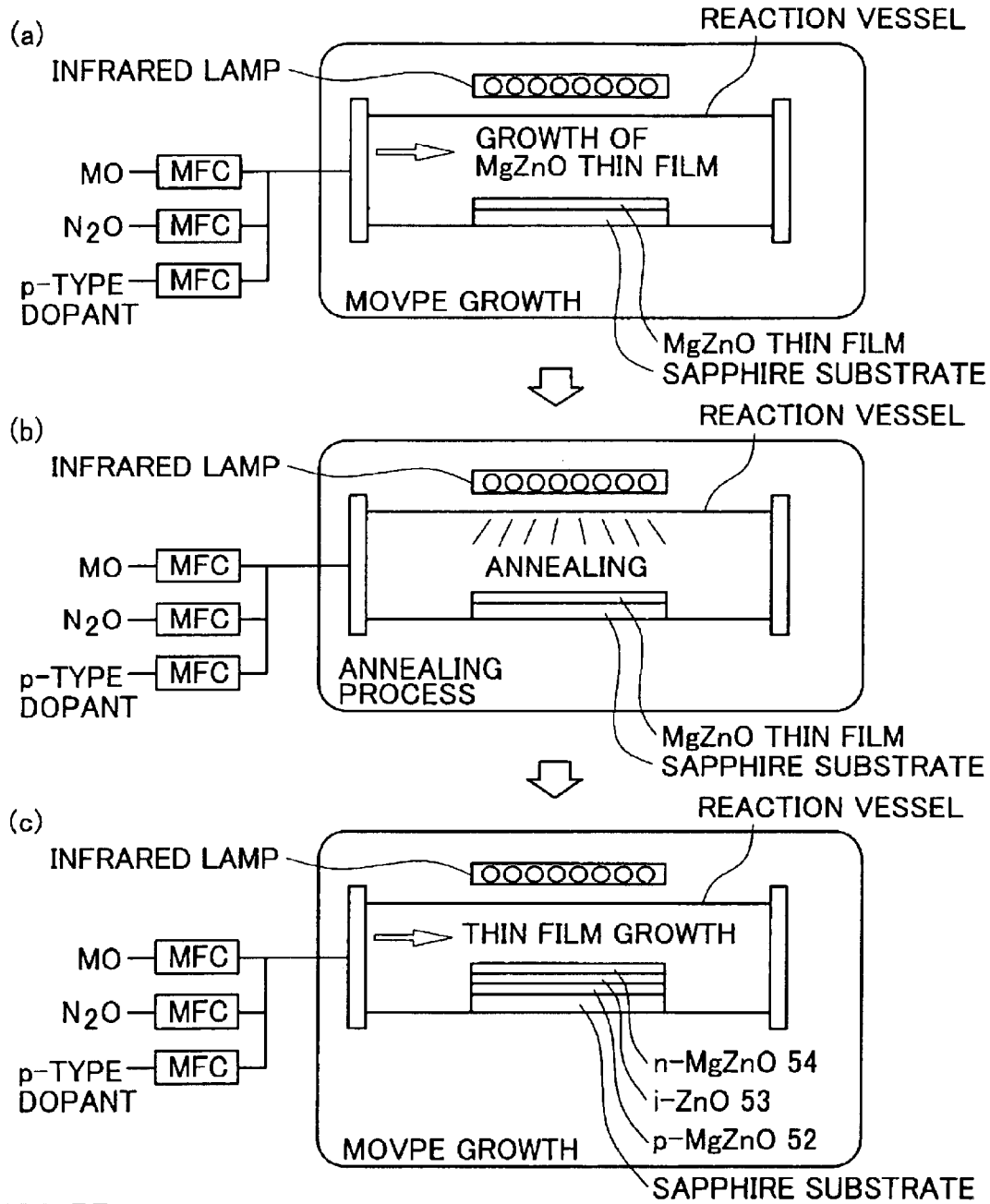
FIG. 5A is schematic drawings for explaining a growth process of the light emitting layer portion of the light emitting device having a type shown in FIG. 4 in Embodiment 1 of the invention.
Figure 5B:
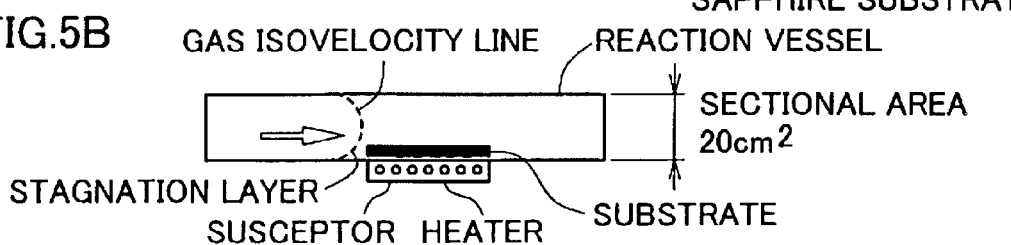
FIG. 5B is a schematic sectional view of a reaction vessel shown in FIG. 5A.

All of the p-type MgZnO layer 52, MgZnO active layer 53 and the n-type MgZnO layer 54 can continuously be formed by the MOVPE process using the same source materials and in the same reaction vessel as shown in FIG. 5A. In this case, the growth is preferably allowed to proceed at slightly lower temperatures, typically at 300° C. to 400° C., so as to reduce reactivity with the GaN buffer layer (not shown in FIG. 5A), and to raise the lattice matching property. The substrate can be heated using a heater embedded in a susceptor for holding the substrate, as shown in FIG. 5B.

Examples of the major materials for composing the individual layers are such as follows:

oxygen component source gas: preferably supplied in a form of oxidative compound gas in view of suppressing an excessive reaction with organometallic compounds described later, although oxygen gas is allowable, typified by $N_2O$, NO, $NO_2$ and CO, where $N_2O$ (nitrous oxide) adopted in this embodiment;

Zn source (metal component source) gas: dimethyl zinc (DMZn), diethyl zinc (DEZn), etc.; and Mg source (metal component source) gas: bis-cyclopentadienyl magnesium ($Cp_2Mg$), etc.

Examples of the p-type dopant gas include the followings:

Li source gas: n-butyl lithium, etc.;

Si source gas: silicon hydrides such as monosilane;

C source gas: hydrocarbons (typically alkyl containing one or more C atoms); and Se source gas: hydrogen selenide, etc.

One or more selected from the group consisting of Al, Ga and In can be allowed to function as excellent p-type dopants when added together with N. Examples of the dopant gas include the followings:

Al source gas: trimethyl aluminum (TMAl), triethyl aluminum (TEAl), etc.;

Ga source gas: trimethyl gallium (TMGa), triethyl gallium (TEGa), etc.; and

In source gas: trimethyl indium (TMIn), triethyl indium (TEIn), etc.

For the case where N is used as a p-type dopant together with a metal element (Ga), the p-type MgZnO layer is grown while supplying a gas which serves as an N source together with an organometallic gas which serves as a Ga source. In particular in this embodiment, $N_2O$ used as an oxygen component source also serves as an N source.

The individual source gases are fed into the reaction vessel after being appropriately diluted with a carrier gas (nitrogen gas, for example). Ratio of flow rates of the organometallic compound gases MO which respectively serves as Mg source and Zn source is controlled using mass flow controllers MFC or the like, corresponding to variety in the alloy composition of the individual layers. Also flow rates of $N_2O$, which is an oxygen component source gas, and a p-type dopant source gas are controlled by the mass flow controllers MFC.

The n-type MgZnO layer 54 can be grown by a method in which oxygen deficiency is intentionally produced so as to attain n-type conductivity, where it is effective to lower the atmospheric pressure (lower than 10 Torr (1.3332 kPa), for example) than that in the cases where the MgZnO active layer 53 and the p-type MgZnO layer 52 is formed. It is also allowable to form the layer by separately introducing an n-type dopant. It is still also allowable to increase ratio of Group II to Group VI elements (supply II/VI ratio) of the source materials.

For the growth of the MgZnO active layer 53 and p-type MgZnO layer 52, a unique method capable of suppressing oxygen deficiency as described in the next is adopted. That is, as expressed by two patterns (a) and (b) shown in FIG. 5A, the layer is grown while continuously supplying an oxygen component source gas ($N_2O$), whereas intermittently interrupting supply of the organometallic gases, to thereby make use of the time duration of interrupted supply of the organometallic gases as an effective duration of the annealing for suppressing generation of the oxygen deficiency, or for repairing the undesirably generated oxygen deficiency.

The oxygen deficiency is caused by elimination of oxygen during the layer growth. To suppress the oxygen deficiency, it is therefore essential to fully react metal ions (Zn and Mg) derived from the organometallic gases with oxygen derived from the oxygen component source gas. Because bond energy between oxygen and Zn or Mg is relatively large, oxygen once bound with the metals in a stoichiometric manner will become less likely to be eliminated again. It is, however, considered that oxygen tends to be eliminated in an intermediate state where the reaction is not fully completed, and that the layer growth at the lower temperature region as described in the above is particularly causative of the oxygen deficiency due to the incomplete reaction.

Figure 7A:
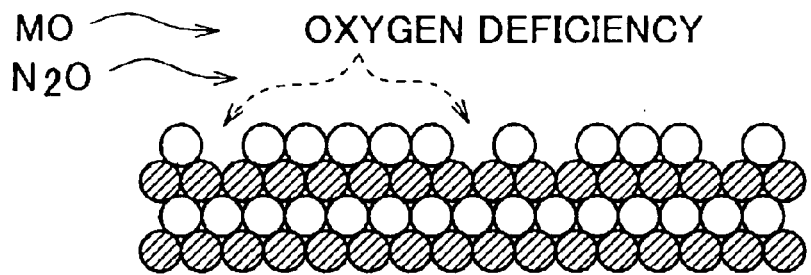
FIG. 7A is a drawing for explaining operation of the method of fabricating the light emitting device of the Embodiment 1 of the invention.
Figure 7B:
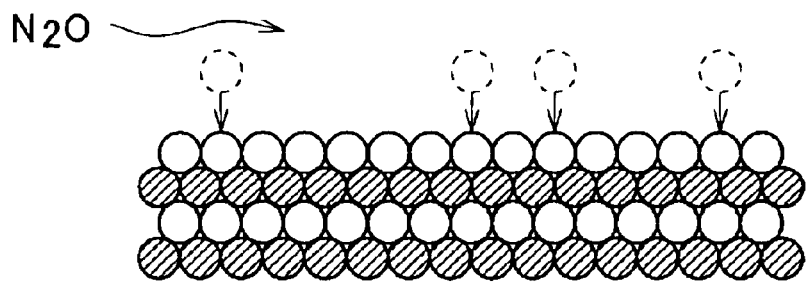
FIG. 7B is an explanatory drawing as continued from FIG. 7A.
Figure 7C:
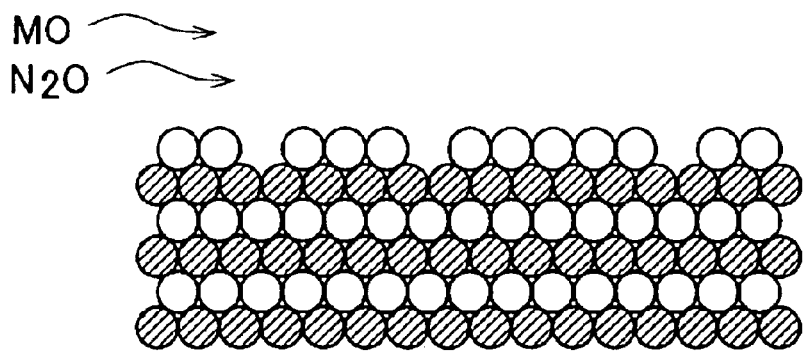
FIG. 7C is an explanatory drawing as continued from FIG. 7B.
Figure 8A:
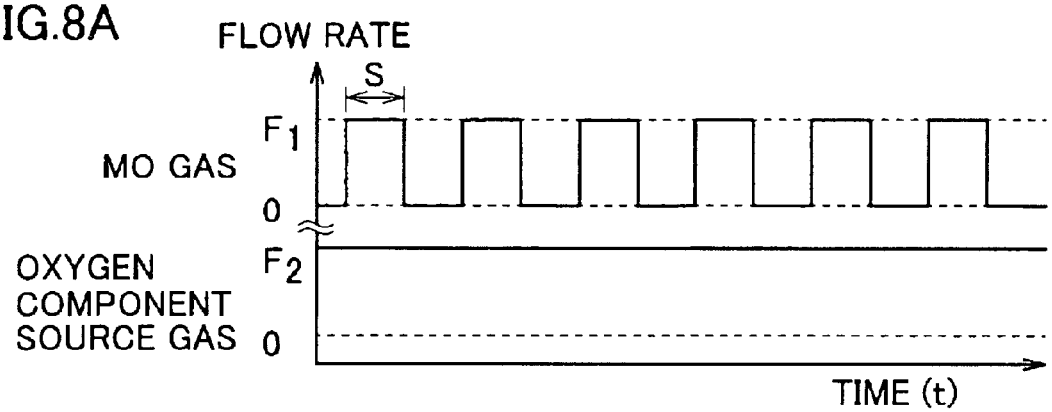
FIG. 8A is a drawing of a first example of a supply sequence for an organometallic gas and an oxygen component source gas in the process shown in FIG. 5A.

It is therefore preferable, as shown in FIG. 7A, to proceed the layer growth only to an extremely small thickness so as to prevent the oxygen deficiency from being incorporated deep inside the layer, and then, as shown in FIG. 7B, to anneal the layer while interrupting the supply of the organometallic gases but continuing only the supply of the oxygen component source gas ($N_2O$), because the reaction between unreacted portions of the oxygen component source gas and organometallic metal gases is promoted, and the formation of the oxygen deficiency is suppressed. Even if the oxygen deficiency should generate, it is expected that the oxygen component source gas decomposes and generated oxygen is adsorbed so as to repair the oxygen deficiency. After completion of the annealing over a duration of time necessary and sufficient for fully expressing these effects, the supply of the organometallic compound gas is restarted as shown in FIG. 7C, to thereby further continue the layer growth. These processes are repeated thereafter. FIG. 8A shows an exemplary supply sequence of the organometallic gases (MO) and the oxygen component source gas. Growth of the MgZnO active layer 53 and the p-type MgZnO layer 52 can be proceeded basically in a similar manner, except that the dopant gas is not supplied for the former, but supplied only for the latter.

In this case, it is necessary that the surface of the layers during the annealing is kept at a temperature higher by 100° C. or more than the layer growth temperature and lower than the melting point of the oxide (700° C. in this embodiment), in order to promote decomposition of the oxygen component source gas, rearrangement of the adsorbed oxygen for repairing the oxygen deficiency, and binding reaction with metal ions already incorporated within the layer. The temperature higher by less than 100° C. than the layer growth temperature may result in only an insufficient effect of suppressing the oxygen deficiency. On the other hand, it is self-evident that the temperature exceeding the melting point of the oxide is nonsense. Because the annealing temperature is set higher than the substrate temperature in the layer growth, it is convenient to use a separate heater specialized for the annealing, besides a heater for heating the substrate. The separate heater is exemplified by an infrared lamp in FIG. 5A.

Once the oxygen deficiency is formed in the newly-grown portion of the layer, it is advantageous to anneal the layer before the oxygen deficiency is buried in view of smoothly repairing it under milder conditions. It is therefore effective to set a unit of the discontinuous (intermittent) layer growth to monoatomic layer (adjacent oxygen packing layer and metal ion packing layer are deemed to comprise monoatomic layer) or around. Introduction period s for the organometallic compound gas is thus set so as to afford an amount of introduction of the gas necessary for the growth of the monoatomic layer.

Figure 9A:
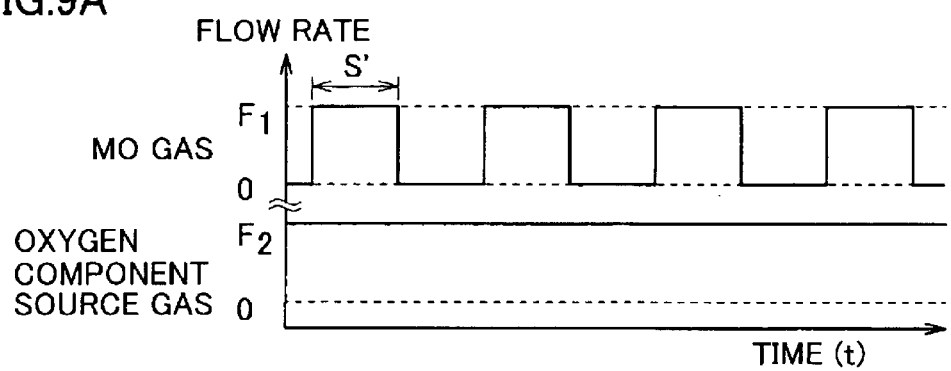
FIG. 9A is a drawing of a fifth example of the same.
Figure 9B:
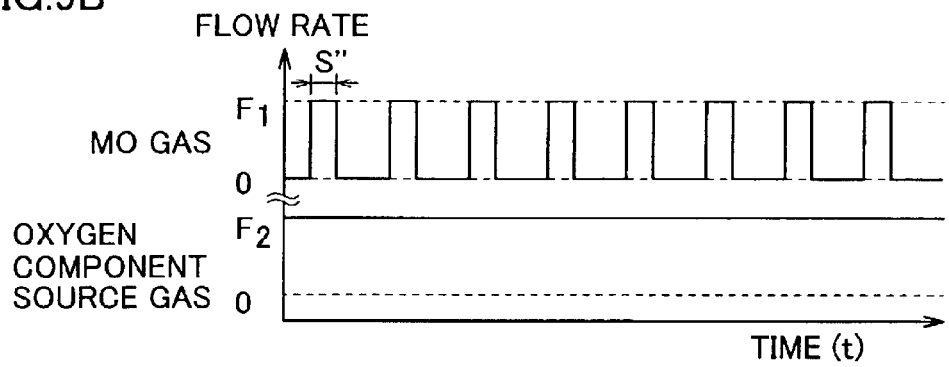
FIG. 9B is a drawing of a sixth example of the same.

The introduction of the organometallic compound gases may be effected in a period s' longer than the period s for forming a complete monoatomic layer as shown in FIG. 9A, or may be effected in a shorter period s" as shown in FIG. 9B, so far as it falls within a range from 0.5 atomic layers to 2 atomic layers. The introduction period s less than 0.5-atomic-layers-equivalent time may lower the fabrication efficiency, and the exceeding 2-atomic-layers-equivalent time may reduce the merit of the intermittent layer growth, because time of annealing for suppressing the oxygen deficiency becomes too long. The introduction time s of the organometallic compound gases is, therefore, preferably set considering the time required for reaction of oxygen atoms with the metal atoms, and relaxation of strain in the crystal lattice.

On the other hand, the annealing time needs some consideration. The reaction per se between the metal atom and oxygen atom completes within a relatively short time, but an additional time is substantially necessary for purging of the organometallic gas out from the reaction vessel in order to ensure uniform reaction (while actual variation pattern of flow rate should always show transient periods in which flow rate of the organometallic gas varies with time, when switched from the annealing period including the purge-out time, the transient periods are not illustrated in FIGS. 8A to 8C, and FIGS. 9A and 9B for simplicity). Assuming now that the sectional area of the reaction vessel allowing the gas flow as 20 cm$^2$ as shown in FIG. 5B, a total gas volume as 50 liters/min (converted value for the standard state), and a length of the heated portion including the substrate along the gas flow direction as 5.0 cm, a minimum necessary time for the purging is calculated as 0.002 seconds. However, the time for purging of 0.002 seconds is practically insufficient, because it is technically difficult to keep a signal input/output cycle of a gas sequencer precisely as short as less than 0.1 seconds, and a stagnation layer is formed in the vicinity of the inner wall of the reaction vessel and at the heated portion including the substrate, where the flow rate is slower. It is therefore preferable to set an interruption time for the introduction of the organometallic compound as long as 1 second or more so as to tolerate the mechanical accuracy. Specific conditions for the annealing typically relate to a nitrogen flow rate of 10 liters/min (converted value for the standard state), N$_2$O flow of 1 liter/min (converted value for the standard state), a layer surface temperature of 700° C., a pressure of 760 Torr (101.3 kPa), and a retention period for one cycle of 5 to 15 seconds.

Figure 8B:
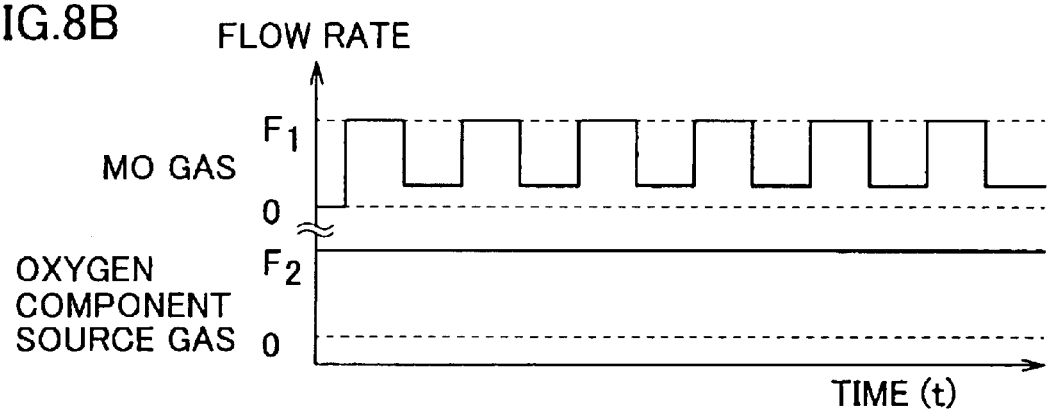
FIG. 8B is a drawing of a second example of the same.
Figure 8C:
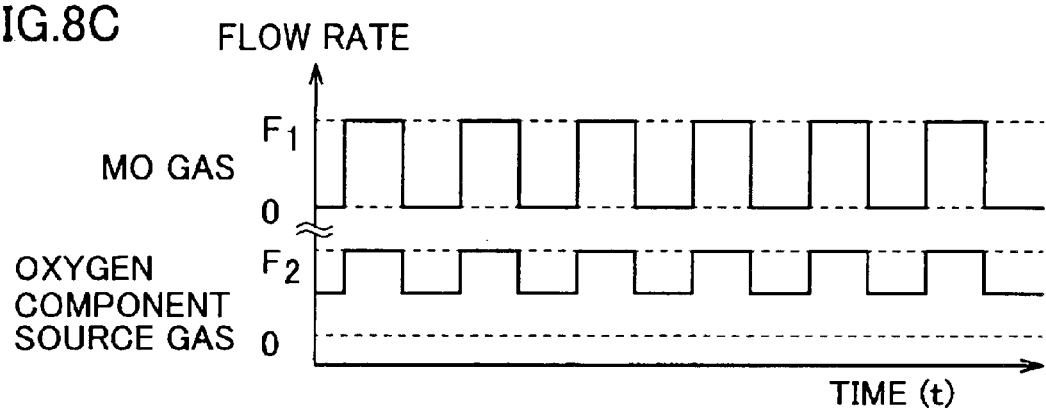
FIG. 8C is a drawing of a third example of the same.
Figure 8D:
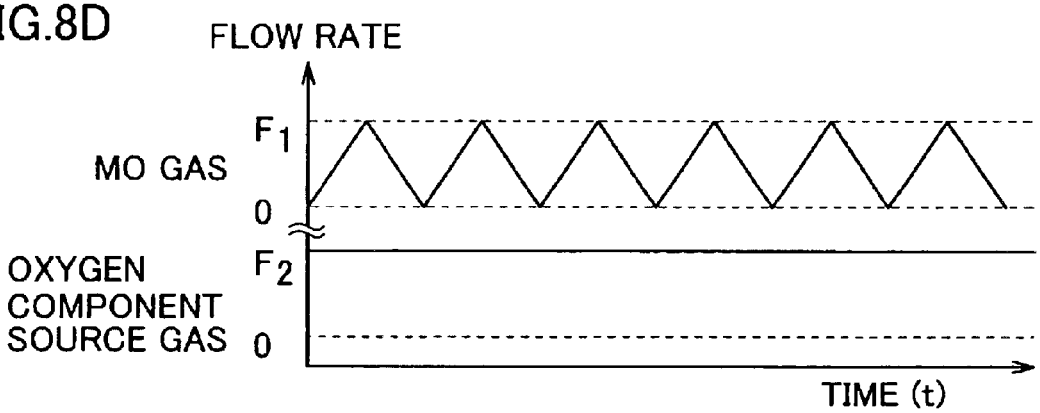
FIG. 8D is a drawing of a fourth example of the same.

It is also allowable to keep supply of a small amount of the organometallic compound gas during annealing period, as shown in FIG. 8B, rather than completely interrupting the supply, so far as the suppressive effect for the oxygen deficiency will not largely be ruined. It is also allowable to reduce the supply volume of the oxygen component source gas from the supply volume during the layer growth as shown in FIG. 8C, because oxygen during the annealing period is necessary only in an amount consumed for suppressing or repairing the oxygen deficiency. It is still also allowable to gradually increase or decrease the amount of supply of the organometallic compound gas as shown in FIG. 8D, instead of the step-wise variation shown in FIG. 8A.

During the layer growth while introducing the organometallic gases, it is effective to keep pressure in the reaction vessel at 10 Torr (1.3332 kPa) or above. This is more successful in suppressing the oxygen elimination, and in growing the MgZnO layer having a less amount of oxygen deficiency. In particular for the case where N$_2$O is used as the oxygen component source, the above-described setting of the pressure successfully prevents N$_2$O from being rapidly dissociated, and this makes it possible to more effectively suppress generation of the oxygen deficiency. The higher the atmospheric pressure rises, the larger a suppressive effect for the oxygen elimination becomes, where a pressure of only as high as 760 Torr (1 atm, or 101.3 kPa) or around may be sufficient for obtaining the effect. Adoption of a pressure of 760 Torr (101.3 kPa) or below means that the reaction vessel is conditioned at normal pressure or reduced pressure, and this requires only a relatively simple seal structure of the vessel. On the contrary, adoption of a pressure exceeding 760 Torr (101.3 kPa) means that the vessel is pressurized, and this requires a slightly stronger seal structure in order to prevent leakage of the internal gases, and further requires a pressure-proof structure or the like for the case where the pressure is considerably high, where the suppressive effect for the oxygen elimination becomes more distinctive in anyway. The upper limit of the pressure in this case should be determined to an appropriate value considering a balance between the cost of the apparatus and attainable suppressive effect for the oxygen elimination (typically 7,600 Torr (10 atm, or 1.013 MPa) or around).

Figure 6:
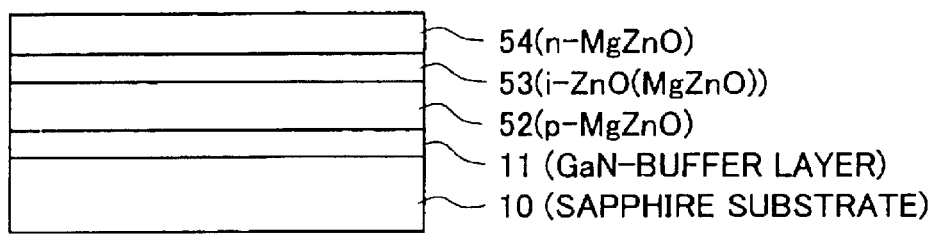
FIG. 6 is a drawing for explaining an exemplary fabrication process of the light emitting device having a type shown in FIG. 4.
Figure 6:
Figure 6:
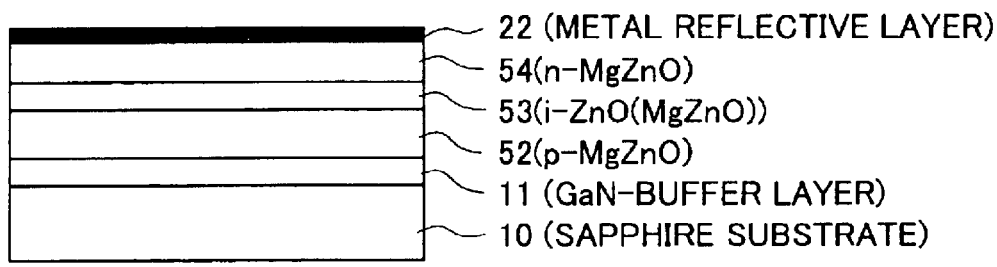
Figure 6:
Figure 6:
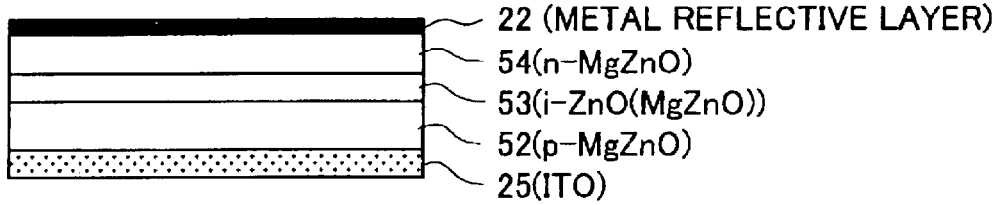
Figure 6:
Figure 6:
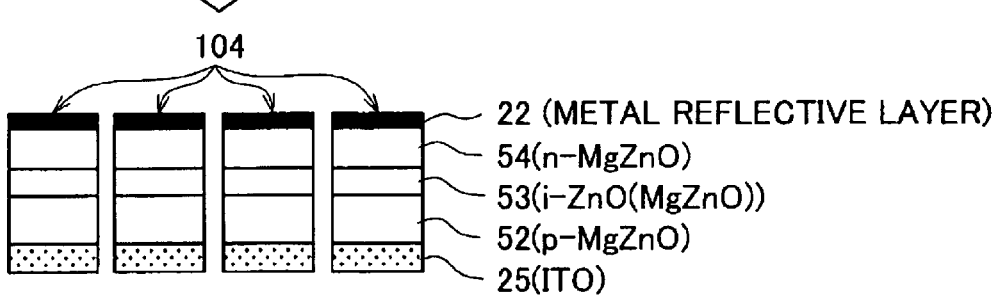

After completion of the growth of the light emitting layer portion, a metal reflective layer 22 is formed on the n-type MgZnO layer 54 as shown in (b) of FIG. 6, the sapphire substrate 10 is separated as shown in (c) of FIG. 6, and a transparent conductive material layer 25 (e.g., ITO film) is formed on the p-type MgZnO layer 52. Thereafter as shown in (d) of FIG. 6, the light emitting device 104 is obtained by dicing. It is also allowable herein to leave the growth substrate such as sapphire substrate unseparated, and to use it as a part of the device.

The annealing for suppressing the oxygen deficiency for the MgZnO active layer 53 and p-type MgZnO layer 52 may collectively be carried out after the layer growth completed. In this case, it is also allowable to carry out the annealing after the substrate is transferred to a separate furnace specialized for annealing different from the reaction vessel. The annealing is preferably carried out each time the MgZnO active layer 53 and p-type MgZnO layer 52 are grown. In view of repairing the oxygen deficiency incorporated into the layer, the annealing is preferably carried out at a temperature range slightly higher than that in the case where the layer growth and annealing are repeated in an intermittent manner. Specific conditions for the annealing typically relates to nitrogen flow rate of 10 liters/min (converted value for the standard state), $N_2O$ flow rate of 1 liter/min (converted value for the standard state), a layer surface temperature of 800° C., a pressure of 760 Torr (101.3 kPa), and an annealing period of 30 minutes.

Figure 10A:
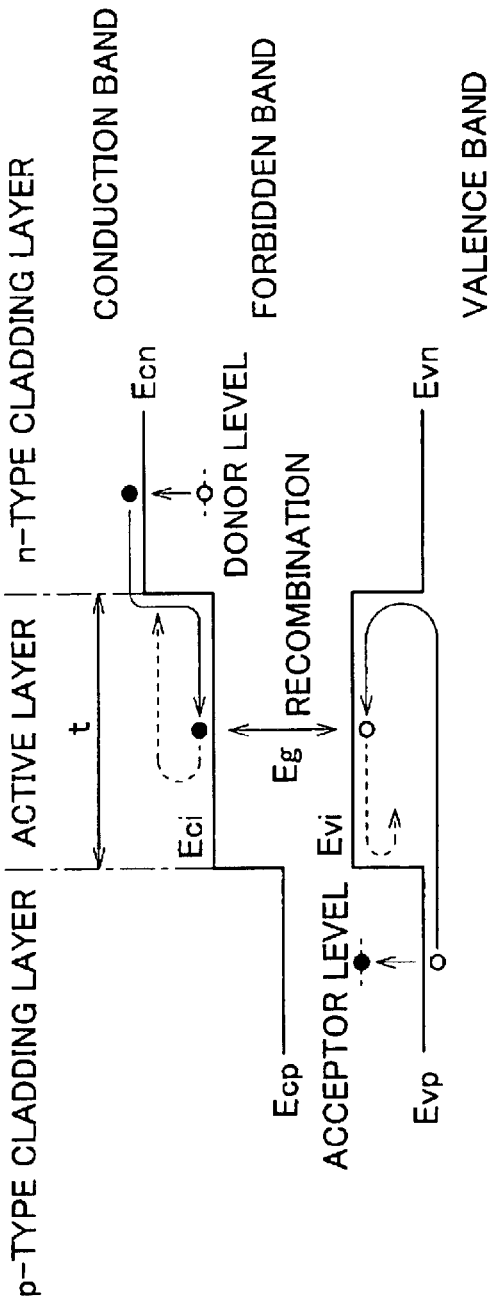
FIG. 10A is a schematic band chart of a light emitting device using a junction structure of Type-I and Type-II band lineups.

The active layer 33 shown in FIG. 1 can also be formed using a semiconductor capable of forming a Type-II band lineup between itself and the p-type MgZnO layer 2. An example of such active layer 33 is an InGaN layer (referred to as InGaN active layer, hereinafter). It is to be noted now that "a Type-II band lineup is formed between the active layer and the p-type $Mg_xZn_{1-x}O$ layer" means a junction structure as shown in FIG. 10A, in which the individual energy levels of the bottom of the conduction band and the upper end of the valence band $E_{cp}$, $E_{vp}$ of the p-type cladding layer (p-type $Mg_xZn_{1-x}O$ layer 2), and the individual energy levels of the bottom of the conduction band and the upper end of the valence band $E_{ci}$, $E_{vi}$ of the active layer satisfy the following relations of inequality:

$$E_{ci} > E_{cp} \quad (3)$$

$$E_{vi} > E_{vp} \quad (4)$$

In this structure, no specific barrier will appear for the forward diffusion of electrons (n-type carriers) from the active layer to the p-type cladding layer, but a relatively high potential barrier is formed for the reverse diffusion of holes (p-type carriers) from the active layer to the p-type cladding layer. This promotes carrier recombination in the active layer, and can achieve high emission efficiency. Assuming now that the layer is expressed as $In_\alpha Ga_{1-\alpha}N$, where α is an InN alloy composition, a relation of $0.34 \leq \alpha \leq 0.47$ is preferably adopted for blue visible light emission, and a relation of $0 \leq \alpha \leq 0.19$ is preferably adopted for ultraviolet emission.

In this case, the n-type cladding layer 34 preferably uses a semiconductor capable of forming a Type-I band lineup between itself and the active layer. An example of such n-type cladding layer 34 is an n-type AlGaN ($Al_\beta Ga_{1-\beta}N$) layer. It is to be noted now that "a Type-I band lineup is formed between the n-type cladding layer and the active layer" means a junction structure, as shown in FIG. 10A, in which the individual energy levels of the bottom of the conduction band and the upper end of the valence band $E_{ci}$, $E_{vi}$ of the active layer, and the individual energy levels of the bottom of the conduction band and the upper end of the valance band $E_{cn}$, $E_{vn}$ of the n-type cladding layer (n-type AlGaN layer 4) satisfy the following relations of inequality:

$$E_{ci} < E_{cn} \quad (5)$$

$$E_{vi} > E_{vn} \quad (6)$$

In this structure, a relatively high potential barrier is formed for the reverse diffusion of electrons from the n-type cladding layer to the active layer, and a well-type potential barrier is formed at the upper end of the valence band corresponding to the position of the active layer, to thereby enhance the confinement effect of holes. All of these promote carrier recombination in the active layer, and consequently achieve high emission efficiency.

In the structures shown in FIG. 10A, a suppressive effect of reverse diffusion of holes from the active layer to the p-type cladding layer can successfully be raised by increasing the energy barrier height ($E_{vi} - E_{vp}$) at the upper end of the valence band. For this purpose, it is effective to raise MgO alloy composition of the p-type $Mg_xZn_{1-x}O$ layer 2 (that is, value of x) composing the p-type cladding layer. The alloy composition x is determined depending on desired current density, so as not to cause excessive leakage of the carriers towards the p-type cladding layer. In a typical case where the active layer 33 is composed of an InGaN layer, the alloy composition x is preferably set within a range from 0.05 to 0.2 or around for light emitting diode, and 0.1 to 0.4 or around for semiconductor laser light source.

Figure 10B:
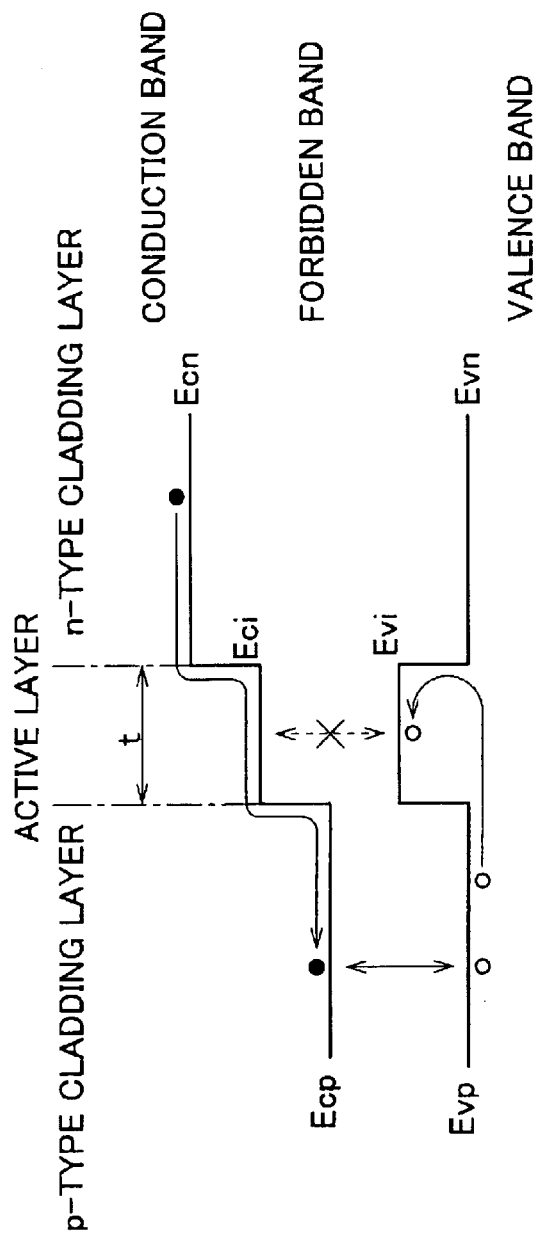
FIG. 10B is a schematic band chart of another example.

The bottom of the conductive band descends in a stepwise manner from the active layer towards the p-type cladding layer, and the electrons not contributed to the emissive recombination in the active layer then flow into the p-type cladding layer having a higher carrier concentration, and become no more contributable to light emission due to Auger recombination or the like. In order to raise the emission efficiency, it is therefore necessary that electrons as much as possible recombine with holes before they flow into the p-type cladding layer, and it is therefore effective to increase the thickness t of the active layer to a certain level or above (e.g., 30 nm or above). As shown in FIG. 10B, too small thickness t of the active layer increases electrons possibly flow into the p-type cladding layer and become not contributable to the light emission, and this results in lowered emission efficiency. On the other hand, increase in the thickness t of the active layer beyond a necessary level results in lowered carrier density in the active layer and thus lowers the emission efficiency. The thickness is thus typically set to 2 µm or below.

In FIG. 10A, it is advantageous in view of suppressing non-emissive recombination at the junction boundary that a relation of $E_{cp} > E_{vi}$ is satisfied similarly for the case where the InGaN active layer is used, that is, the p-type cladding layer and the active layer have forbidden bands which overlap with each other.

(Embodiment 2)

The next paragraphs will describe an embodiment of the second invention. Since the essential portion of the light emitting device to which the second invention is applicable is same as described in Embodiment 1, detailed description will be omitted (see FIGS. 1 to 4, and FIGS. 10A and 10B). As shown in (a) of FIG. 6, the GaN buffer layer 11 is epitaxially grown again on the sapphire substrate 10, and further thereon the p-type MgZnO layer 52 (typically of 50 nm thick), the MgZnO active layer 53 (typically of 30 nm thick) and the n-type MgZnO layer 54 (typically of 50 nm thick) are formed in this order (inverted order of the growth also acceptable). The epitaxial growth of the individual layers in this embodiment can be carried out by the MOVPE process similarly to as described in Embodiment 1, where differences reside in the following points. More specifically, in the growth of the MgZnO active layer 53 and p-type MgZnO layer 52 herein, a ultraviolet lamp (e.g., excimer ultraviolet lamp) as a ultraviolet light source is disposed opposing to the main surface of the substrate in order to suppress the generation of the oxygen deficiency, and the source gases are supplied between the substrate and ultraviolet light source while irradiating ultraviolet light from the ultraviolet lamp towards the main surface of the substrate.

Figure 11A:
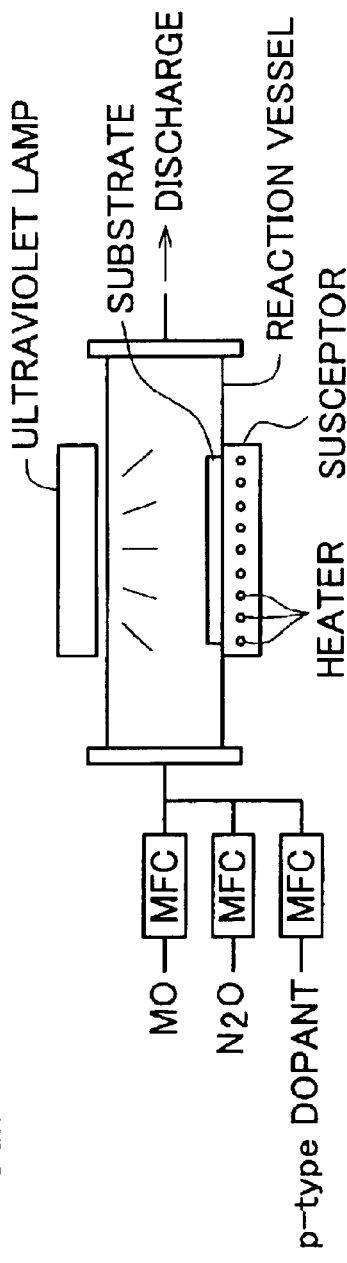
FIG. 11A is a schematic drawing for explaining a vapor phase growth apparatus for growing the light emitting layer portion using a ultraviolet lamp based on the MOVPE process in Embodiment 2 of the invention.
Figure 11B:
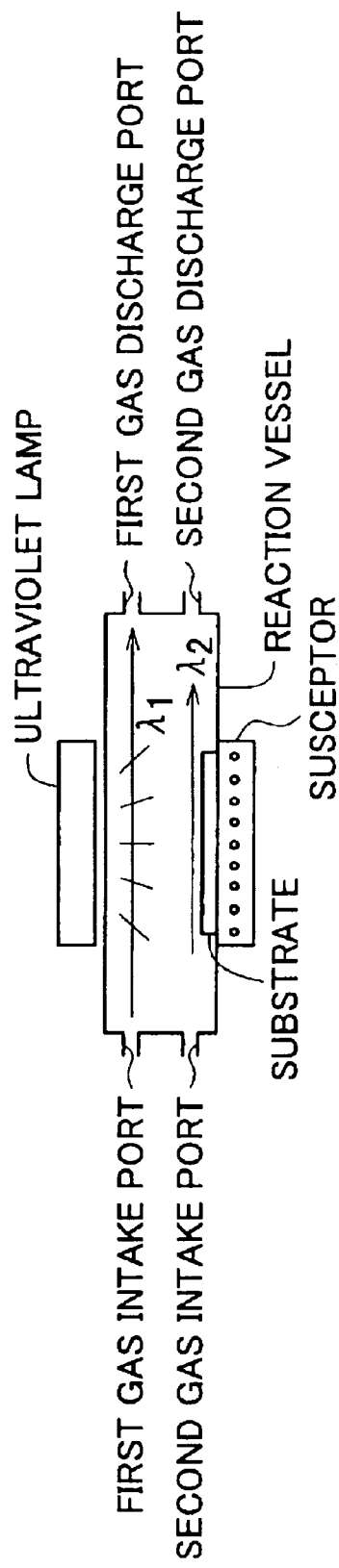
FIG. 11B is a schematic drawing of a modified example of FIG. 11A.

FIGS. 11A and 11B show an apparatus used for vapor-phase epitaxy process of the light emitting layer portion using the ultraviolet lamp based on the MOVPE process. Similarly to as described previously referring to FIG. 5A, all of the p-type MgZnO layer, MgZnO active layer and n-type MgZnO layer can sequentially be formed in the same reaction vessel using the same source gases. In this case, it is preferable to proceed the growth at slightly lower temperatures, typically at 300 to 400° C. so as to reduce the reactivity with the GaN buffer layer and raise the lattice matching property. The substrate can be heated using a heater embedded in a susceptor for holding the substrate.

The wall portion of the reaction vessel is configured as a transparent wall portion composed of a quartz glass or the like, and the ultraviolet lamp is disposed outside the reaction vessel, so as to effect the ultraviolet irradiation through the transparent wall portion towards the substrate. The ultraviolet lamp available herein has an emission wavelength of approximately 172 nm, and an output power density of approximately 8 mW/cm$^2$ when the flow rates of $N_2O$ and organometallic compound gas are within a range from 100 cm$^3$/min to 1,000 cm$^3$/min and 10 cm$^3$/min to 100 cm$^3$/min, respectively.

It is supposed that ultraviolet light irradiated to the substrate is once absorbed by the substrate, and can highly activate the outermost portion of the layers under growth based on the light excitation effect. That is, a highly activated status similarly to as obtained in the layer growth under high temperatures can locally be realized in the outermost portion of the layer. Also a part of the source gases is brought into a high-energy transition status (radical, etc.) by the ultraviolet irradiation. As a consequence, the organometallic gases and oxygen component source gas ($N_2O$) can react in the vicinity of the activated outermost portion of the layer, in a stoichiometric manner without causing unreacted components or the like, and the layer growth is promoted in a manner less causative of the oxygen deficiency.

Radicals of the organometallic gases and oxygen component source gas are unstable in general, and the radicals ascribable to these components will be converted into other decomposition products not contributable to the oxide formation reaction, if a status in which these radicals are brought into a close vicinity enough for causing reaction is not realized for a long duration of time. While this kind of decomposition reaction is more likely to proceed as temperature of the system elevates, this can be suppressed to a certain extent typically by lowering the substrate temperature to as relatively low as 400° C. or below. The ultraviolet irradiation can enhance reaction activity in the vicinity of the main surface of the substrate, and this makes it possible to readily form the oxide semiconductor layer having only a less amount of oxygen deficiency even when the substrate temperature cannot be raised so high for various reasons.

On the other hand, probability of the oxide formation reaction contributable to the layer growth is higher in the boundary layer (in which mass transfer is governed by diffusion, also referred to as stagnation layer), and lower in an area outside the boundary layer and having a large gas flow rate. It is thus understood that the larger the flow rate of the gas flowing through the reaction vessel grows, the thinner the boundary layer becomes, and the growth speed of the oxide is depressed. Adjusting now the flow rate of the source gases supplied between the substrate and the ultraviolet lamp (ultraviolet light source) so as to be faster on the ultraviolet light source side than that on the main surface side as shown in FIG. 11B, the reaction products become less likely to deposit on the wall portion of the reaction vessel in the vicinity of the ultraviolet lamp, and this makes it possible to avoid a nonconformity such that the deposit shadows ultraviolet light from the light source to thereby degrade the reaction efficiency. More specifically, as shown in FIG. 11B, a gas intake port and a gas discharge port of the reaction vessel are formed so as to be divided into a first gas intake/discharge port, and a second gas intake/discharge port, and the flow rate is adjusted so as to make a gas flow rate $\lambda_1$ on the first gas intake/discharge port side is faster than a gas flow rate $\lambda_2$ on the second gas intake/discharge port side.

Figure 12:
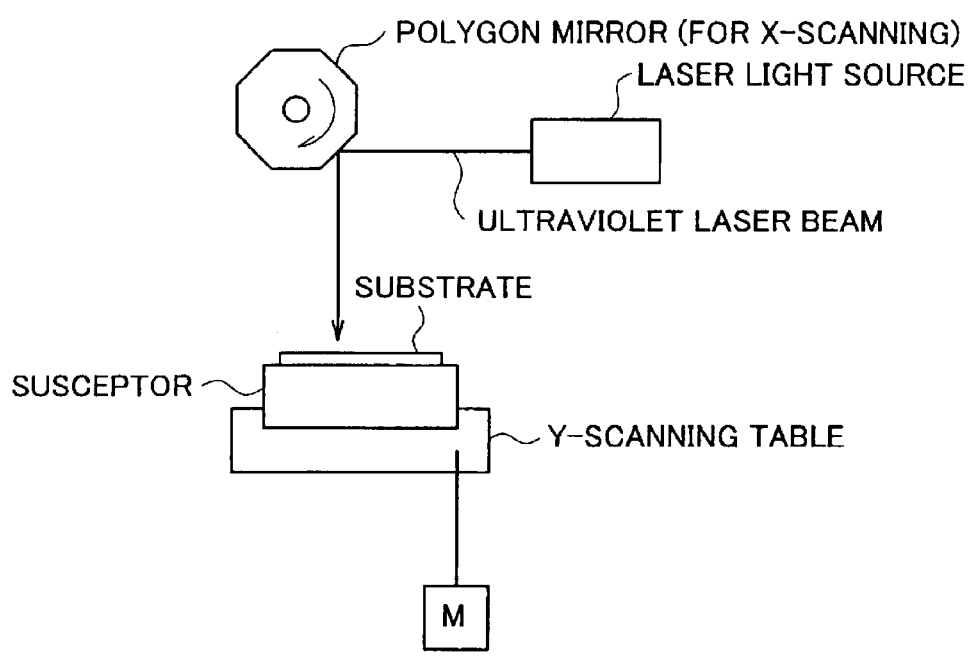
FIG. 12 is a conceptual drawing of a vapor-phase epitaxy process for forming the light emitting layer portion using ultraviolet laser beam.

The ultraviolet lamp is advantageous in view of ensuring a large irradiation area, and of allowing the reaction for the oxide layer formation to proceed in a uniform and efficient manner. On the other hand, it is also allowable to irradiate a ultraviolet laser beam in a two-dimensional scanning manner over the substrate as shown in FIG. 12. This system can use a light convergence density larger than that available from the ultraviolet lamp, and thus further enhance the reaction efficiency. In an exemplary configuration shown in FIG. 12, a laser light source composed as an excimer laser light source or a semiconductor laser light source is scanned in the X direction with the aid of a polygon mirror, and in synchronization therewith a susceptor holding the substrate is driven in the Y direction, which crosses the X direction, with the aid of a Y-scanning table, so as to scan over the entire portion of the main surface of the substrate with the laser beam in a two-dimensional manner.

The process steps after completion of the growth of the light emitting layer portion are same as those described in Embodiment 1 referring to (b) to (d) of FIG. 6.

(Embodiment 3)

The next paragraphs will describe an embodiment of the third invention. Although the essential portion of the light emitting device to which the third invention is applicable is almost the same as described in Embodiment 1 (see FIGS. 1 to 5A, and FIGS. 10A and 10B), it is essential in the third invention to form the buffer layer as described below. That is, the buffer layer has the c-axis of the wurtzite crystal structure oriented to the thickness-wise direction, has a single metal atom layer as a metal monoatomic layer formed in contact with the substrate, and has the residual oxygen atom layers and metal atom layers alternatively stacked successive to the metal monoatomic layer. An exemplary fabrication process will be explained below.

Figure 13:
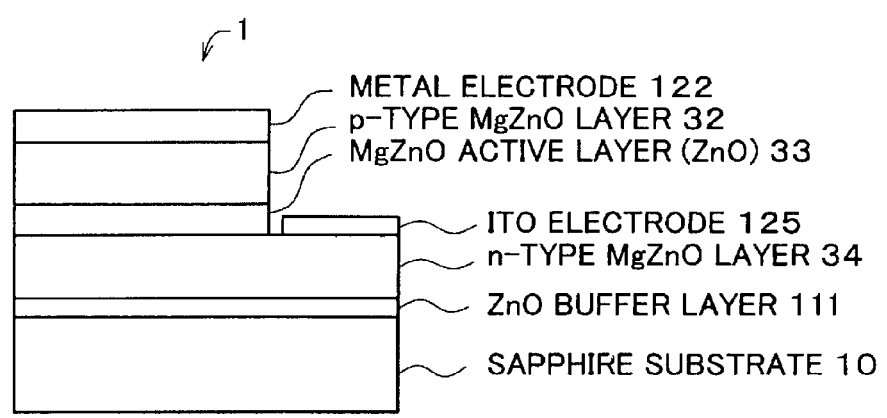
FIG. 13 is a schematic drawing showing a specific example of the light emitting device of Embodiment 3 of the invention.

First as shown in FIG. 13, a buffer layer 111 composed of MgZnO is epitaxially grown on the sapphire substrate 10, and further thereon an n-type MgZnO layer 34 (typically of 50 nm thick), an MgZnO active layer 33 (typically of 30 nm thick) and a p-type MgZnO layer 32 (typically of 50 nm thick) are formed in this order (inverted order of the growth or layers 32 to 35 also acceptable). These layers can be grown by the MOVPE process.

Figure 14A:
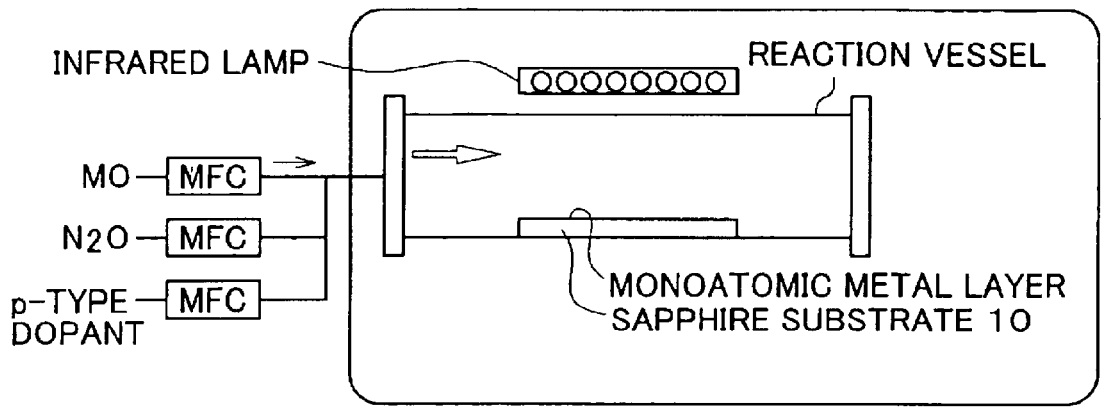
FIG. 14A is a drawing for explaining an exemplary fabrication process of the light emitting device shown in FIG. 13.
Figure 14B:
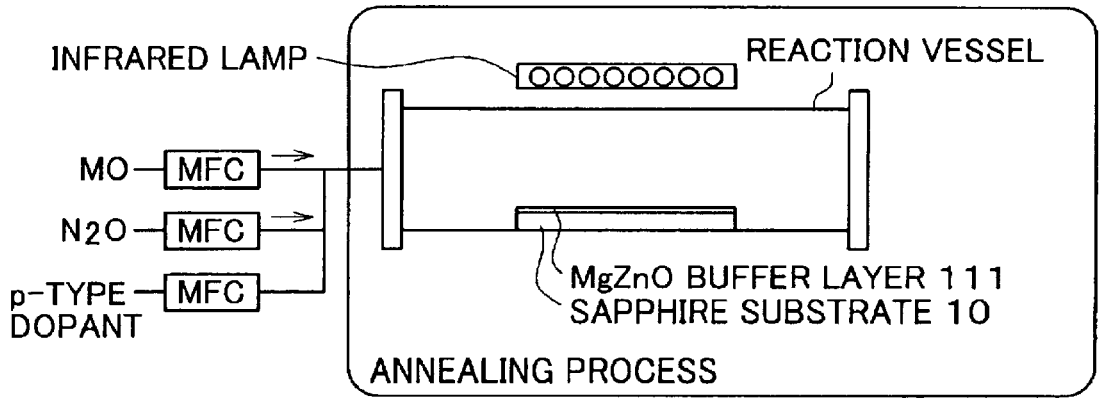
FIG. 14B is a drawing of a process step as continued from FIG. 14A.
Figure 14C:
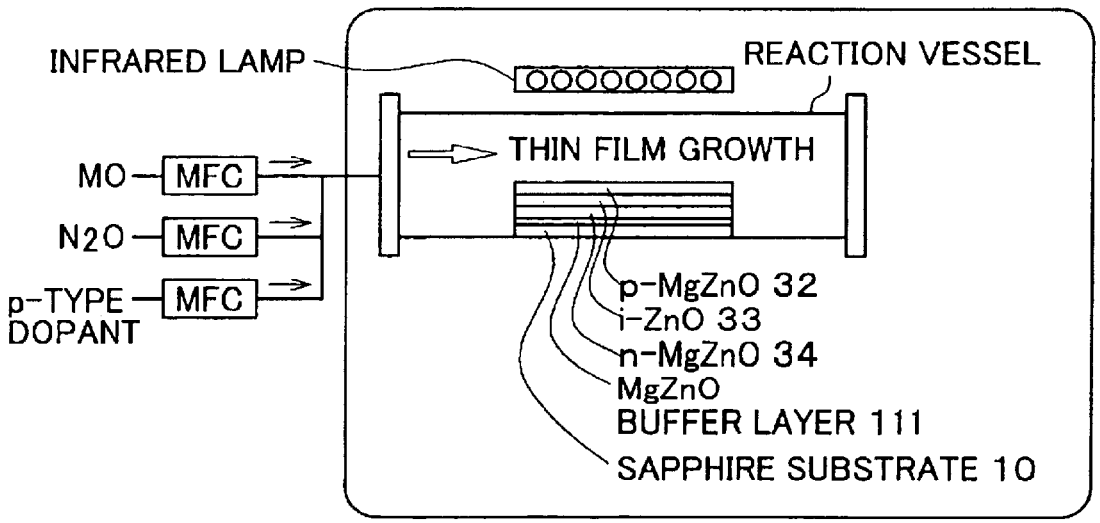
FIG. 14C is a drawing of a process step as continued from FIG. 14B.

By the MOVPE process, all of the buffer layer 111, n-type MgZnO layer 34, MgZnO active layer 33 and p-type MgZnO layer 32 can continuously be formed by the MOVPE process using the same source materials and in the same reaction vessel as shown in FIGS. 14A to 14C. Temperature in the reaction vessel is adjusted using a heating source (an infrared lamp in this embodiment) so as to promote the chemical reactions for the layer growth. Major source materials for the individual layers and style of feeding thereof are the same as those described in Embodiments 1 and 2.

Figure 15:
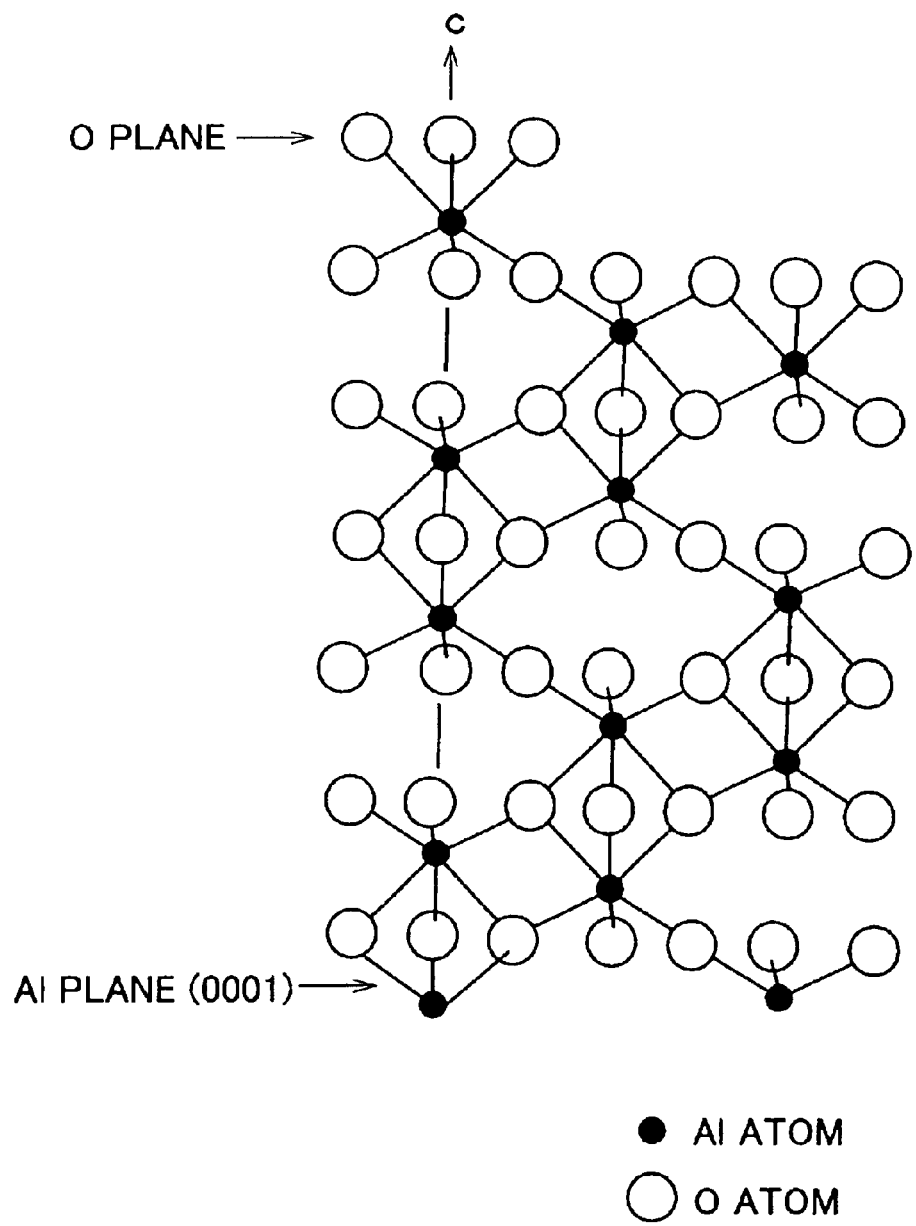
FIG. 15 is a schematic drawing of corundum-type crystal structure.
Figure 17:
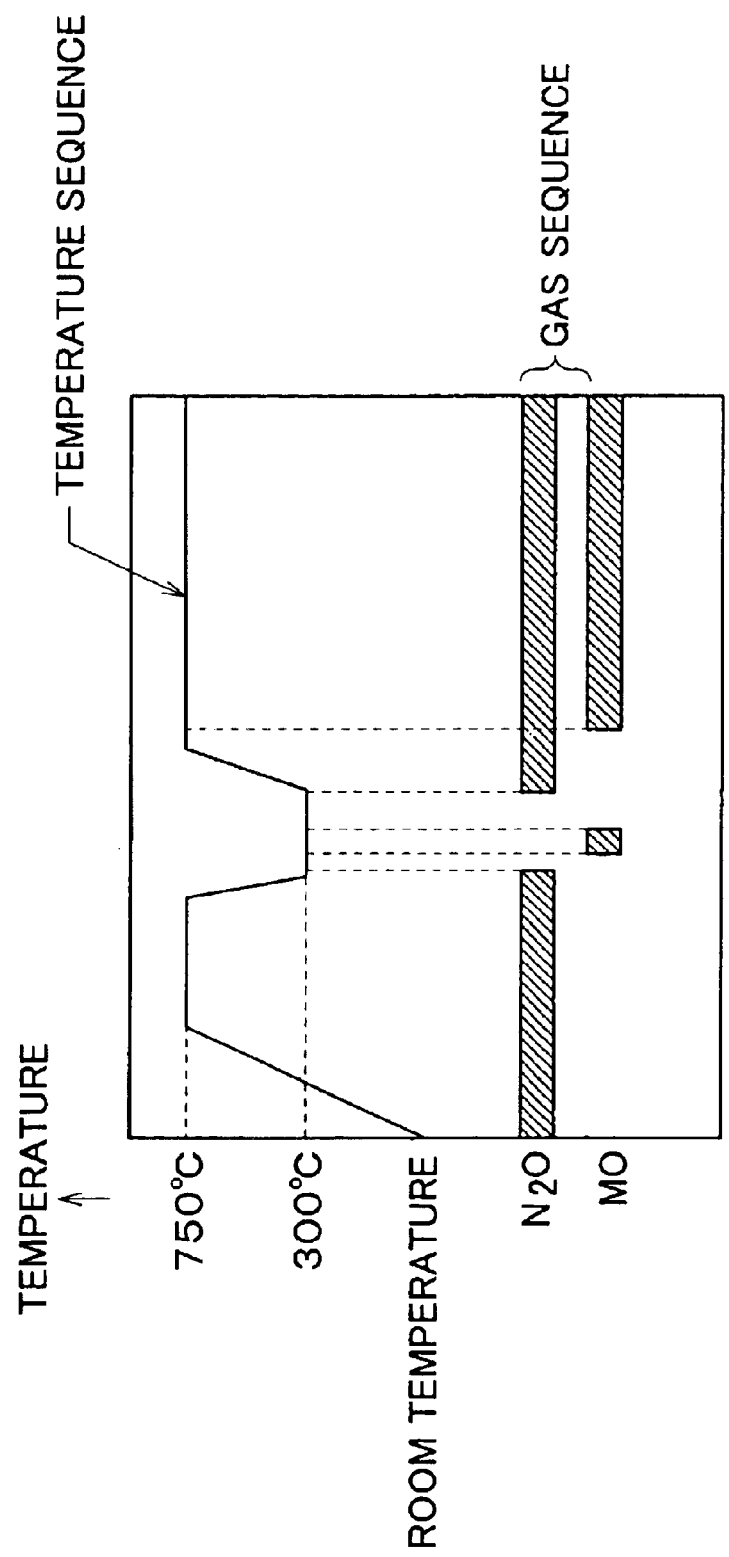
FIG. 17 is a drawing exemplifying a temperature control sequence and gas supply sequence in the process steps shown in FIGS. 14A to 14C.

The buffer layer 111 is grown as described in the next. FIG. 17 shows a control sequence of temperature in the reaction vessel and introduction of the individual gases in this embodiment. The substrate 10 on which the layers are grown is a sapphire (i.e., single crystal alumina) substrate having the c-axis as the principal crystal axis, where the main surface on the oxygen-exposed plane side shown in FIG. 15 is used as a layer growth plane. Prior to the layer growth, the substrate 10 is thoroughly annealed under an oxidative atmosphere. The oxidative gas may be any of those selected from $O_2$, CO and $N_2$, where $N_2O$ is selected in this embodiment so as to be used also as the oxygen component source gas in the layer growth described later. For the case where the annealing is carried out in the reaction vessel for the MOVPE process, preferable conditions for the annealing relate to a temperature of 750° C. or above (but lower than the melting point of the substrate), and an annealing time of 30 minutes or more. It is, however, also allowable to shorten the above-described annealing time if the surface of the substrate can be cleaned to a satisfactory level by wet cleaning or the like.

After completion of the annealing, the substrate temperature is lowered to a first temperature which is set to 250 to 300° C. (set to 350° C. herein) as shown in FIG. 17 in order to suppress generation of the oxygen deficiency, while keeping the oxidative gas atmosphere. After the temperature is stabilized at a set value, supply of the oxidative gas is interrupted, and the gas is then thoroughly purged out by replacing the inner atmosphere of the reaction vessel with nitrogen gas. It is preferable to set the purging time to 5 seconds or longer, although variable depending on shape and capacity of the reaction vessel.

Figure 16A:
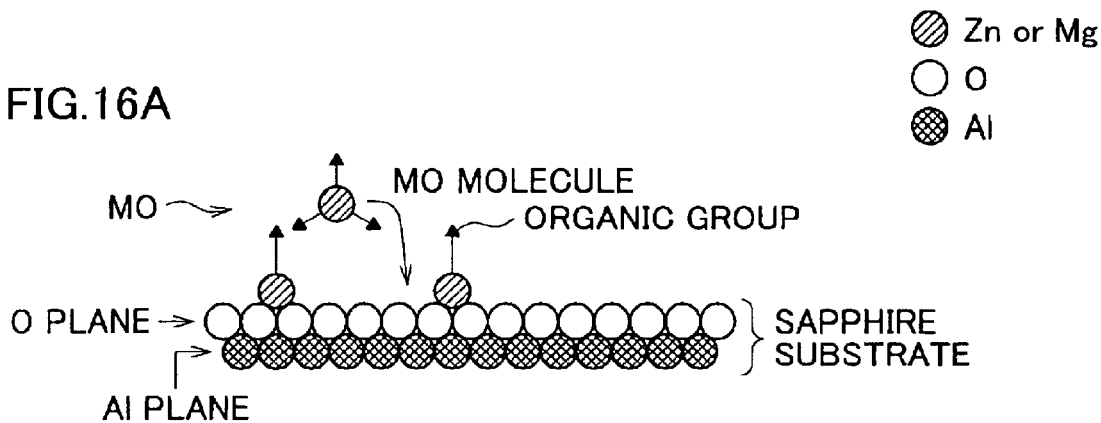
FIG. 16A is a drawing for explaining operation of a method of fabricating a light emitting device of Embodiment 3 of the invention.
Figure 16B:
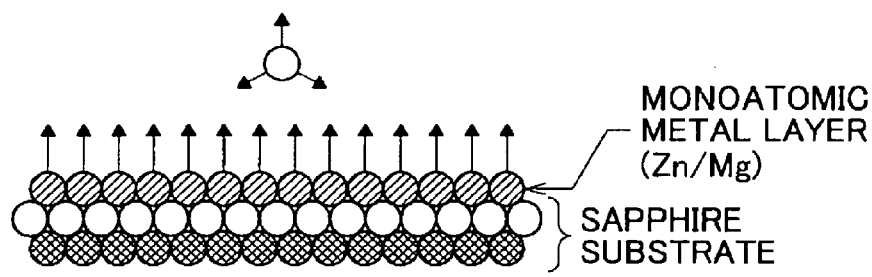
FIG. 16B is a drawing for explaining operation as continued from FIG. 16A.

Next, as shown in FIGS. 14A and 16A, the organometallic gas MO is supplied into the reaction vessel, and the first metal atomic layer which composes a part of the buffer layer 111 is formed as a monoatomic layer by the ALE process. As previously explained in the above, growth of the monoatomic layer in the ALE process saturates once a single atomic layer is completed based on the self-termination function, and no more growth of the metal atomic layer would occur even if the supply of the organometallic compound gas MO is continued.

Figure 16C:
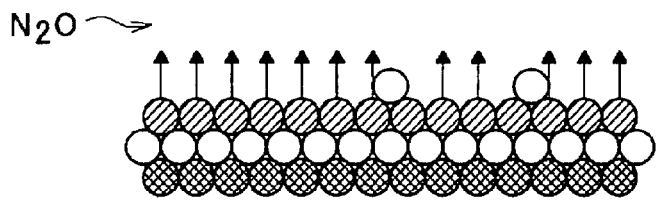
FIG. 16C is a drawing for explaining operation as continued from FIG. 16B.

Thereafter the supply of the organometallic gas MO is interrupted, the gas is thoroughly purged out by replacing the inner atmosphere of the reaction vessel with nitrogen gas, and as shown in FIG. 16C, $N_2O$ is introduced as the oxygen component source gas (and also as a gas for creating the oxidative atmosphere), and the oxygen atom layer is formed only by a single atomic layer by the ALE process. This results in the formation of the MgZnO layer only by a single atomic layer on the substrate 10.

Figure 16D:
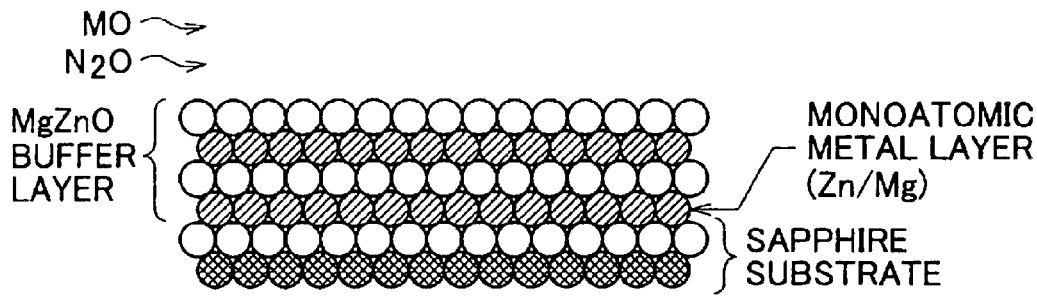
FIG. 16D is a drawing for explaining operation as continued from FIG. 16C.

The temperature in the reaction vessel is thereafter increased to a second temperature which is set to 400 to 800° C. (set to 750° C. herein) as shown in FIG. 17 while keeping the oxidative gas atmosphere, and also keeping the organometallic gas continuously supplied, so as to form the residual portion of the buffer layer by the general MOVPE process as shown in FIGS. 14B and 16D. In this process, the buffer layer 111 having an excellent planarity can be obtained by growing the layer at a speed of 0.1 nm/sec or around until a thickness of 10 nm or around is attained, and thereafter at a speed of 1 nm/sec. In view of obtaining the buffer layer excellent both in the crystallinity and planarity, it is also preferable to grow a plurality of layers from the first layers by the ALE process.

Figure 18A:
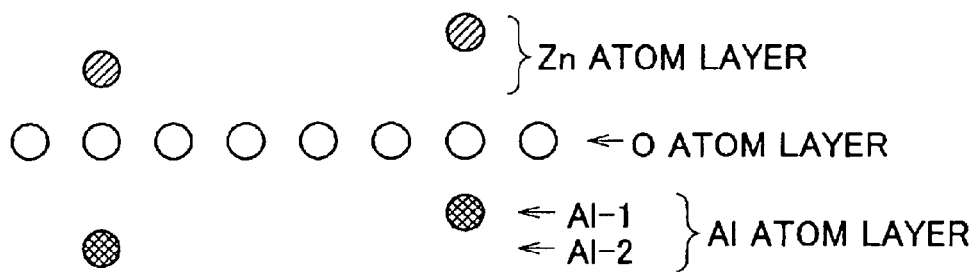
FIG. 18A is a drawing for explaining effect of configuring a mixed metal atom layer as a metal monoatomic layer grown by the ALE process.
Figure 18B:
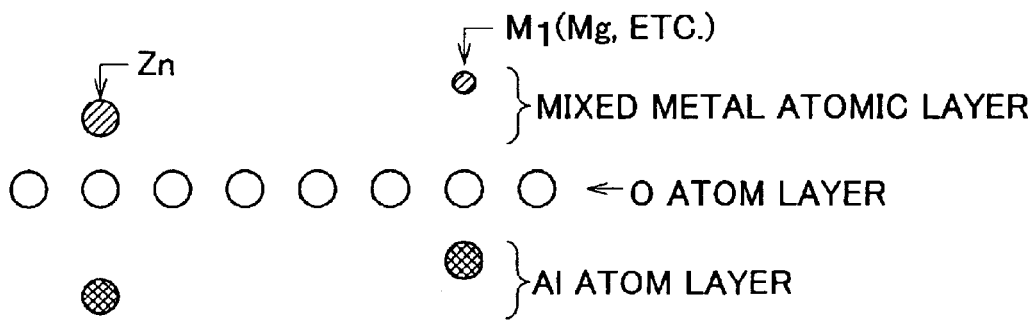
FIG. 18B is a drawing for explaining the effect as continued from FIG. 18A.
Figure 18C:
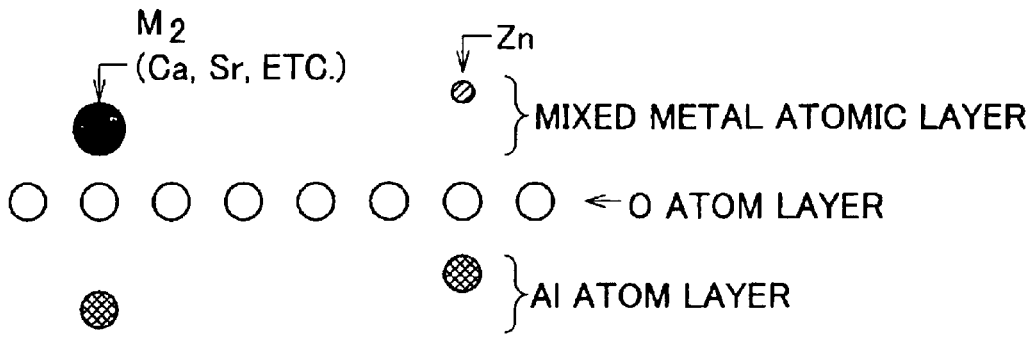
FIG. 18C is a drawing for explaining the effect as continued from FIG. 18B.
Figure 19A:
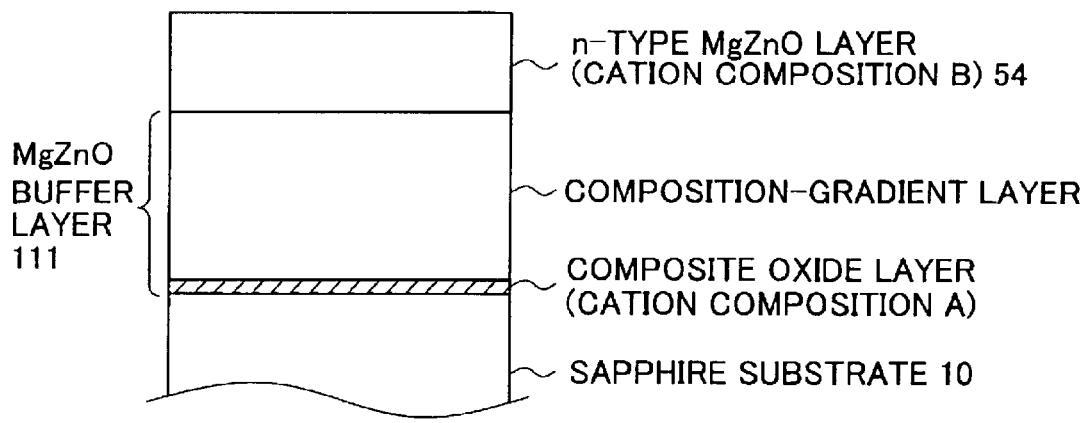
FIG. 19A is a drawing for explaining an example in which a metal composition gradient layer is configured as a buffer layer.
Figure 19B:
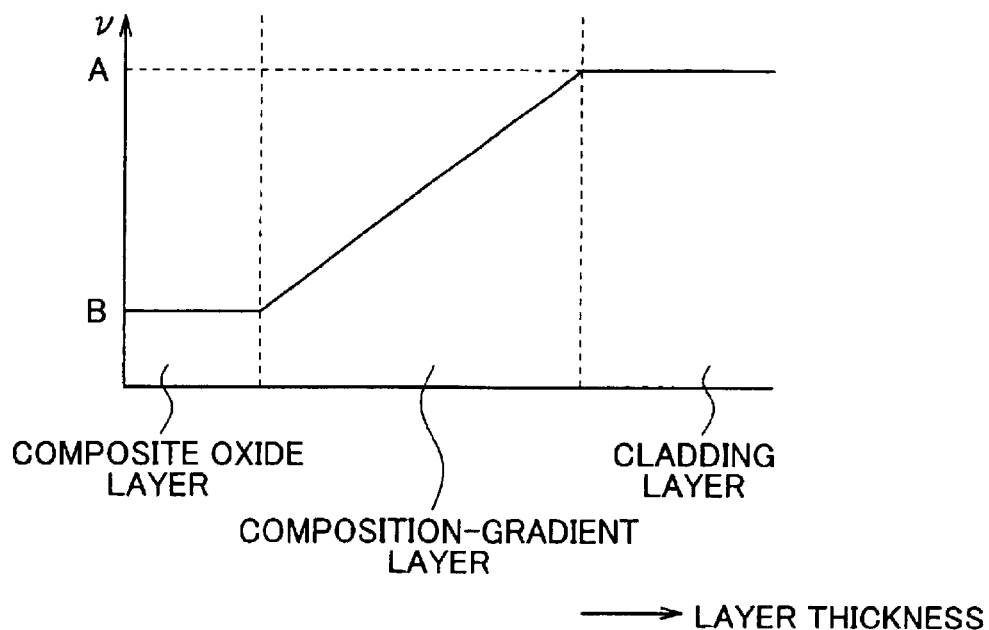
FIG. 19B is a drawing for explaining the metal composition gradient layer shown in FIG. 19A.

Although the buffer layer 111 of this embodiment is formed as a simple oxide layer comprising ZnO, it may also be formed as a composite oxide layer of MgZnO having an appropriate alloy composition harmonized with the alloy composition of the adjacent layer on the light emitting-portion side. The Al atom layer located just below the outermost oxygen atom layer of the sapphire substrate comprises, as shown in FIG. 18A, two Al atom sites Al-1 and Al-2, which differ from each other in the distance to the oxygen layer. Assuming now that the metal atom layer formed on the oxygen layer is a Zn atom layer, both sites Al-1 and Al-2 differ in the Coulomb repulsive force between Zn atom and Al atom located while placing the oxygen layer in between. For this reason, Zn atoms corresponding to both sites will have different displacement in the direction normal to the plane of the oxygen atom layer, and this may causative of irregularity in stacking of the later-coming layers. To relieve this effect, as shown in FIGS. 18B and 18C, it is effective to form the first single atomic layer (or a plurality of layers) as a composite oxide layer which contains Group II atom (e.g., Mg) having a smaller ionic radius than Zn, or Group II atom (e.g., Ca, Sr, Ba) having a larger ionic radius by an appropriate ratio, and this can improve the crystallinity of the light emitting layer portion to be obtained. It is now also effective, in view of enhancing the above-described effect, to dispose a composition-gradient layer, having metal cation composition gradated in the thickness-wise direction, between such composite oxide layer (having a metal cation composition A) and the cladding layer (having a metal cation composition B: n-type MgZnO layer 54 herein) formed in contact with the buffer layer 111, in order to ensure continuity between both compositions A and B, as shown in FIG. 19A. In an exemplary case where both of the composite oxide layer and cladding layer are composed of MgZnO, the composition-gradient layer can be formed so that composition parameter ν varies continuously between A and B typically as shown in FIG. 19B, where composition parameter ν represents metal cation composition and is given by $\nu = N_{Mg}/(N_{Mg}+N_{Zn})$, where $N_{Mg}$ is molar content of Mg, and $N_{Zn}$ is molar content of Zn; A is an expression of ν for the composite oxide layer, and B is that for the cladding layer.

After the buffer layer 111 is completed, as shown in FIG. 14C, the n-type MgZnO layer 34, MgZnO active layer 33 and p-type MgZnO layer 32 are formed in this order by the MOVPE process. These process steps are basically same as those described in Embodiments 1 and 2.

In this embodiment, after completion of the growth of the light emitting layer portion, the active layer 33 and the p-type MgZnO layer 32 are partially removed by photolithography or the like as shown in FIG. 13, a transparent electrode 125 comprising indium tin oxide (ITO) or the like is formed, a metal electrode 122 is formed on the residual p-type MgZnO layer 32, and the layers are then diced together with the substrate 10 to thereby produce the light emitting device 1. It is thus self-evident that the light emitting device 1 is configured so that the buffer layer 111 composed of MgZnO is formed on the substrate 10, and further thereon the light emitting layer portion again composed of MgZnO is formed. Light extraction is therefore available mainly on the transparent sapphire substrate 10 side.

It is to be noted that the light emitting device can of course be configured as shown in FIG. 6. In this case, the layers are formed on the buffer layer 111 in an order inverted from that shown in FIG. 13, that is, the p-type MgZnO layer 32, MgZnO active layer 33 and n-type MgZnO layer 34 are formed in this order. This configuration is advantageous in obtaining the device having an improved weatherability, because a metal layer of MgZnO composing the light emitting layer portion is exposed only after the substrate 10 is separated.

(Embodiment 4)

Figure 20A:
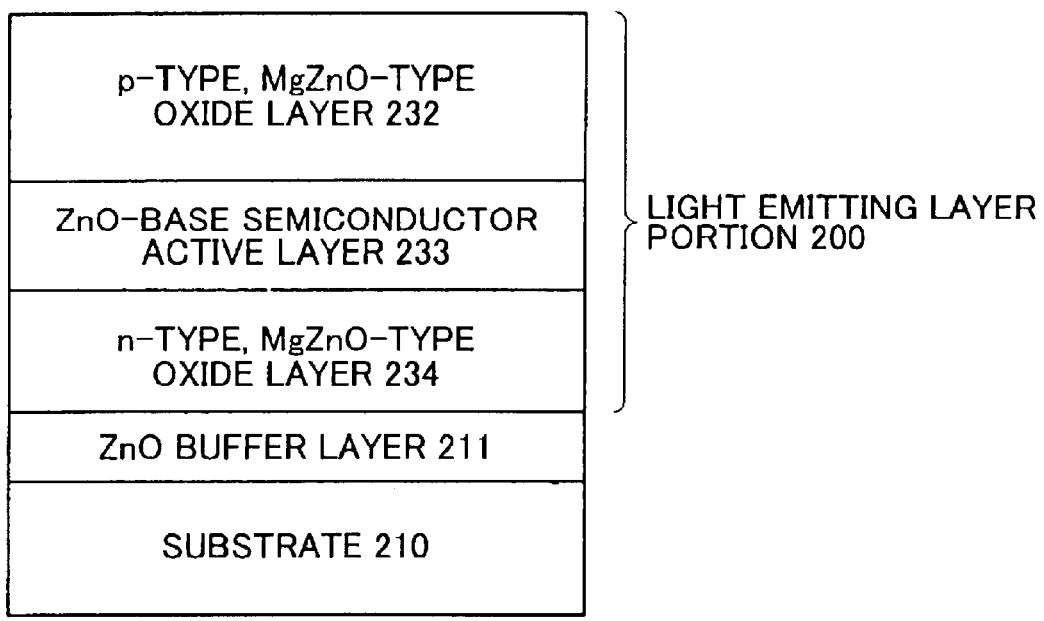
FIG. 20A is a schematic sectional view showing a stacked structure of a first example of the ZnO-base semiconductor light emitting device of Embodiment 4 of the invention.
Figure 20B:
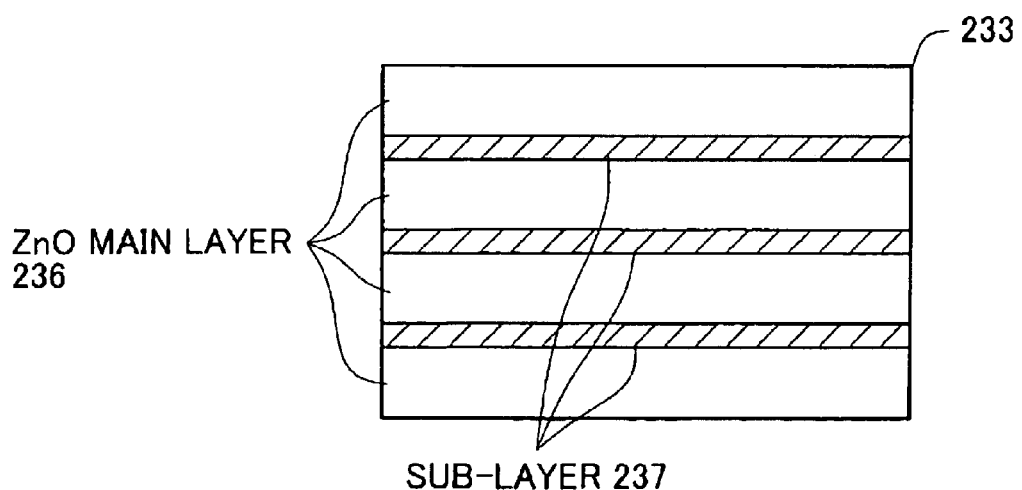
FIG. 20B is a schematic sectional view showing a stacked structure of a second example of the same.

FIGS. 20A and 20B schematically show a stacked structure of the essential portion of the light emitting device in order to explain one embodiment of the fourth invention. As shown in FIG. 20A, on a substrate 210, a ZnO buffer layer 211, an n-type MgZnO-type oxide layer 234, a ZnO-base semiconductor active layer 233 and a p-type MgZnO-type oxide layer 232 are stacked by the epitaxial growth process while keeping lattice matching, to thereby form a double hetero, light emitting layer portion 200. The ZnO-base semiconductor active layer (also simply referred to as active layer) 233 is composed of a ZnO-base semiconductor containing Zn as a Group II element, and containing O together with Se or Te as a Group VI element. FIG. 20A shows the active layer 233 configured as a single layer, whereas FIG. 20B shows the active layer 233 having a multi-layered structure in which sub-layers 237 composed of ZnSe or ZnTe are periodically inserted in a ZnO main layer 236 while keeping an area width equivalent to or less than one molecular layer of the active layer 233.

As shown in FIG. 20A, by composing the active layer 233 using a ZnO-base semiconductor containing Se or Te, it is made possible to introduce Se or Te, which belongs to the same Group with oxygen, to oxygen-deficient sites, and this is successful in improving the crystallinity of the active layer 233 and making the band gap energy thereof well suited to blue-color light emission as described in the above. On the other hand, as shown in FIG. 20B, by composing the active layer 233 so as to have a multi-layered structure in which sub-layers 237 composed of ZnSe or ZnTe are periodically inserted in a ZnO main layer 236, it is made possible to enhance binding property of thus introduced Se or Te with the closest Zn. Although FIG. 20B illustrates the sub-layer 237 as having a coverage ratio of 1, it is also allowable to reduce the coverage ratio to as smaller than 1 in order to prevent Se or Te from being deposited rather than being introduced into the oxygen-deficient sites. The number of formation of the sub-layers 237 can properly be adjusted depending on desired emission wavelength in the active layer 233.

The substrate 210 shown in the FIGS. 20A and 20B may be such as those used in Embodiments 1 to 3. Although the ZnO buffer layer 211 can epitaxially be formed by stacking ZnO crystal, it is also allowable to epitaxially grow either one of ZnS, ZnSe and ZnTe, and then convert them to obtain the ZnO buffer layer 211 by annealing under the oxygen-containing atmosphere.

N-type dopant added to the n-type, MgZnO-type oxide layer 234 (also simply referred to as n-type MgZnO layer 234, hereinafter) and p-type dopant added to the p-type, MgZnO-type oxide layer 232 (also simply referred to as p-type MgZnO layer 232, hereinafter) may be such as those used in Embodiments 1 to 3.

The epitaxial growth of the individual layers shown in FIG. 20A can be carried out based on the MOVPE or MBE process. It is to be noted that MBE in the context of this patent specification include not only MBE in a narrow sense in which both of a metal element component source and a non-metal element component source are used in solid forms, but also include MOMBE (Metal Organic Molecular Beam Epitaxy) using the metal element component source in a form of organometallic compound and the non-metal element component source in a solid form; gas source MBE using the metal element component source in a solid form and the non-metal element component in a gas form; and chemical beam epitaxy (CBE) using the metal element component source in a form of organometallic compound and the non-metal element component source in a gas form.

Also the ZnO main layer 236 shown in FIG. 20B can be formed by the epitaxial growth process similarly to as described in the above. On the other hand, the sub-layer 237, which is composed of ZnSe or ZnTe, and must be adjusted to have an area width equivalent to or less than a single molecular layer of the active layer 233, can be formed by the ALE (Atomic Layer Epitaxy) process in which a Zn-source gas and Se- or Te-source gas, both serve major source materials, are alternatively supplied. A proper adjustment of flow rates of thus supplied source gases makes it possible to reduce the coverage ratio of the sub-layer 237 smaller than 1.

Major source materials for the individual layers, except the Se source and Te source, may be such as those used in the MOVPE process in Embodiments 1 to 3, and also the basic process steps are the same as those described in Embodiments 1 to 3. Available Se-source gases include $H_2Se$, and available Te-source gases include $H_2Te$.

Figure 21:
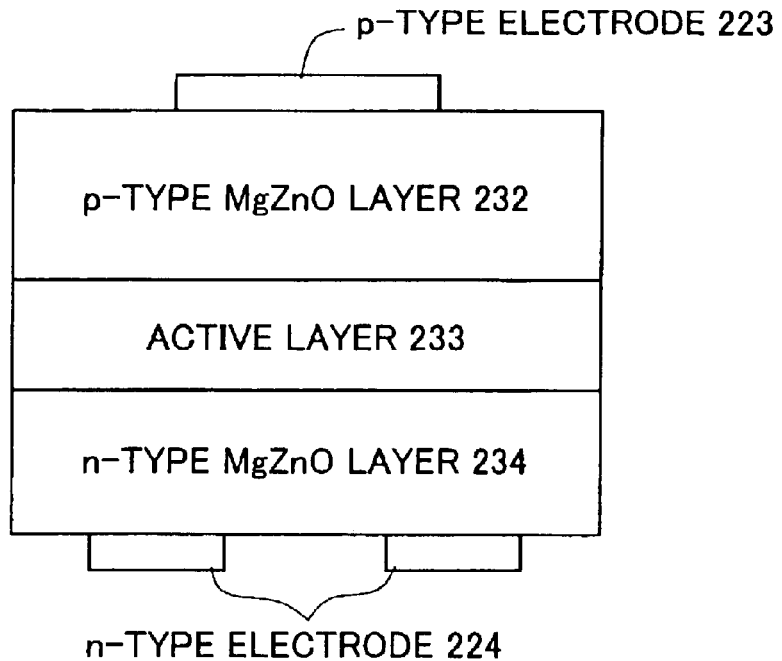
FIG. 21 is a schematic sectional view showing a stacked structure of an exemplary electrode formation status of the ZnO-base semiconductor light emitting device of the fourth embodiment of the invention.
Figure 22:
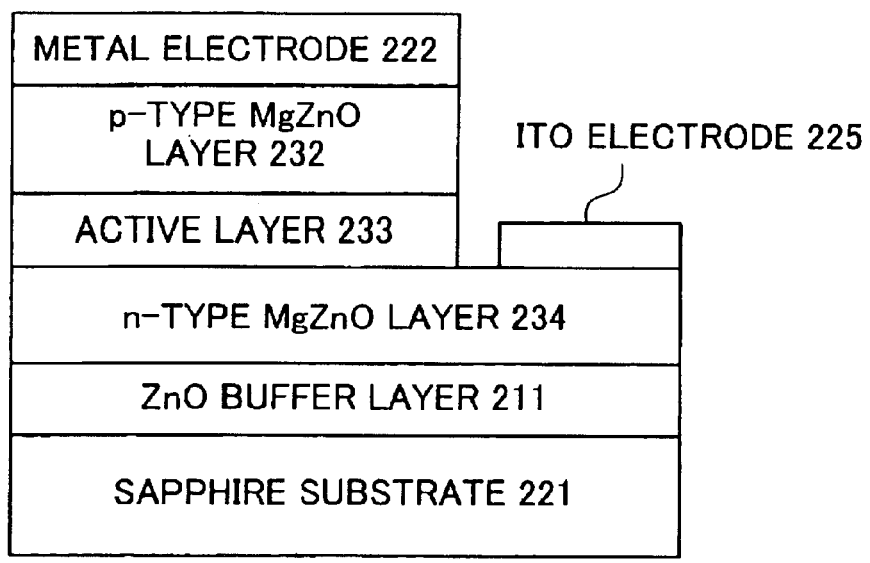
FIG. 22 is a schematic sectional view showing a stacked structure of another exemplary electrode formation status differed from FIG. 4.

After completion of the growth of the light emitting layer portion 200, the substrate 210 is lapped and etched, as shown in FIG. 21, a p-type electrode 223 composed of In and n-type electrodes 224 composed of Au are respectively formed, the stack is diced, and the individual electrodes are bonded with Al wirings, so as to obtain the ZnO-base semiconductor light emitting device. Light extraction is therefore available mainly on the p-type MgZnO layer 232 side. In FIG. 21, the light extraction is, however, not available from the area where the p-type electrode 223 is formed. It is therefore advantageous to partially remove the active layer 233 and p-type MgZnO layer 232 by photolithography or the like as shown in FIG. 22, a transparent electrode 225 comprising indium tin oxide (ITO) or the like is formed, a metal electrode 222 is formed on the residual p-type MgZnO layer 232, and the layers are then diced together with the sapphire substrate 221 to thereby produce the ZnO-base semiconductor light emitting device. Light extraction is therefore available mainly on the transparent sapphire substrate 221 side.

What is claimed is:

1. A method of fabricating a light emitting device having a light emitting layer portion which includes a p-type $Mg_xZn_{1-x}O$ (where, $0 \leq x \leq 1$)-layer, wherein
    the p-type $Mg_xZn_{1-x}O$ layer is grown by a metal organic vapor-phase epitaxy process while supplying organometallic gases, an oxygen component source gas and a p-type dopant gas into a reaction vessel, and is annealed during and/or after completion of the growth thereof in an oxygen-containing atmosphere.

2. A method of fabricating a light emitting device having a light emitting layer portion configured so that an n-type cladding layer, an active layer and a p-type cladding layer composed of a p-type $Mg_xZn_{1-x}O$ (where, $0 \leq x \leq 1$) layer are stacked in this order, comprising:
    an n-type cladding layer growing step for growing the n-type cladding layer; and
    an active layer growing step for growing the active layer; and
    a p-type cladding layer growing step for growing the p-type cladding layer by a metal organic vapor-phase epitaxy process while supplying organometallic gases, an oxygen component source gas and a p-type dopant gas into a reaction vessel, and annealing the p-type cladding layer during and/or after completion of the growth thereof in an oxygen-containing atmosphere.

3. The method of fabricating a light emitting device as claimed in claim 2, wherein the n-type cladding layer comprises an n-type $Mg_zZn_{1-z}O$ (where, $0 \leq z \leq 1$) layer, the active layer comprises $Mg_yZn_{1-y}O$ (where, $0 \leq y < 1$, $x > y$) layer;
    the n-type cladding layer is grown in the n-type cladding layer growing step by supplying organometallic gases and an oxygen component source gas into the reaction vessel; and the active layer growing step is a step for growing the active layer on a substrate by a metal organic vapor-phase epitaxy process while supplying organometallic gases and an oxygen component source gas into the reaction vessel, and includes a step for annealing the layer during and/or after completion of the growth thereof in an oxygen-containing atmosphere.

4. The method of fabricating a light emitting device as claimed in claim 1, wherein the annealing is carried out while interrupting supply of the organometallic gases.

5. The method of fabricating a light emitting device as claimed in claim 1, wherein the oxygen-containing atmosphere during the annealing is created by introducing the oxygen component source gas into the reaction vessel.

6. The method of fabricating a light emitting device as claimed in claim 5, wherein the layer to be annealed is grown while continuously supplying the oxygen component source gas and intermittently interrupting supply of the organometallic gases, to thereby make use of the time duration of interrupted supply of the organometallic gases as an effective duration of the annealing.

7. The method of fabricating a light emitting device as claimed in claim 1, wherein the oxygen component source gas is supplied in a form of an oxidative compound gas.

8. A method of fabricating a light emitting device having a step of growing a semiconductor layer for composing a light emitting layer portion in vapor phase by introducing source gases in a reaction vessel having a substrate disposed therein, and by allowing a semiconductor material generated based on chemical reactions of the source gases to deposit on the main surface of the substrate, wherein a vapor-phase epitaxy of the semiconductor layer is proceeded while irradiating ultraviolet light to the source gases introduced in the reaction vessel.

9. The method of fabricating a light emitting device as claimed in claim 8, wherein a ultraviolet light source is disposed so as to oppose with the main surface of the substrate, and the source gases are supplied between the substrate and the ultraviolet light source while irradiating ultraviolet light towards the main surface.

10. The method of fabricating a light emitting device as claimed in claim 9, wherein a part of the wall portion of the reaction vessel opposing to the main surface of the substrate is configured as a transparent wall portion, the ultraviolet light source is disposed outside the reaction vessel, and ultraviolet light from the ultraviolet light source is irradiated towards the main surface through the transparent wall portion.

11. The method of fabricating a light emitting device as claimed in claim 10, wherein flow rate of the source gases supplied between the substrate and the ultraviolet light source is graded so as to be faster on the ultraviolet light source side and slower on the main surface side.

12. The method of fabricating a light emitting device as claimed in claim 8, wherein a vapor-phase epitaxy is proceeded by a metal organic vapor-phase epitaxy process.

13. The method of fabricating a light emitting device as claimed in claim 12, wherein the metal organic vapor-phase epitaxy process is proceeded by using organometallic gases and an oxygen component source gas as the source gases, so as to allow the semiconductor layer which comprises a metal oxide to grow based on chemical reactions of the organometallic gases with the oxygen component source gas.

14. The method of fabricating a light emitting device as claimed in claim 13, wherein the semiconductor layer is $Mg_xZn_{1-x}O$ (where, $0 \leq x \leq 1$) layer.

15. A method of fabricating a light emitting device having a light emitting layer portion composed of an $Mg_aZn_{1-a}O$-type (where, $0 \leq a \leq 1$)-oxide, wherein a buffer layer is formed on a substrate, the buffer layer having at least an $Mg_aZn_{1-a}O$-type oxide layer on the contact side with the light emitting layer portion, and the light emitting layer portion is grown on the buffer layer;

the $Mg_aZn_{1-a}O$-type oxide layer having wurtzite crystal structure in which metal atom layers and oxygen atom layers are alternatively stacked in the direction of the c-axis, the buffer layer being grown so as to orient the c-axis of the wurtzite crystal structure to the thickness-wise direction, and so as to form a metal atom layer as a metal monoatomic layer on the substrate by the atomic layer epitaxy, and then to form the residual oxygen atom layers and the metal atom layers.

16. The method of fabricating a light emitting device as claimed in claim 15, wherein the atomic layer epitaxy is proceeded in a form of a metal organic vapor-phase epitaxy process in which organometallic gases and an oxygen component source gas are supplied in a reaction vessel having the substrate housed therein.

17. The method of fabricating a light emitting device as claimed in claim 15, wherein the substrate is an oxide single crystal substrate in which oxygen atoms follow hexagonal atomic arrangement, and has C-plane of the hexagonal atomic arrangement exposed in the main surface; and the entire portion of the buffer layer is formed on the main surface of the oxide single crystal substrate so as to orient the c-axis of the wurtzite crystal structure to the thickness-wise direction.

18. The method of fabricating a light emitting device as claimed in claim 17, wherein the oxide single crystal substrate comprises an oxide having corundum structure, and the buffer layer is formed on the main surface thereof in which oxygen atoms are exposed.

19. The method of fabricating a light emitting device as claimed in claim 17, wherein the oxide single crystal substrate is a sapphire substrate.

* * * * *